United States Patent [19]

Matsuura

[11] Patent Number: 5,937,322

[45] Date of Patent: Aug. 10, 1999

[54] SEMICONDUCTOR MANUFACTURING PROCESS WITH OXIDE FILM FORMED ON AN UNEVEN SURFACE PATTERN

[75] Inventor: Masazumi Matsuura, Tokyo, Japan

[73] Assignee: Mitsubishi Denki Kabushiki Kaisha, Tokyo, Japan

[21] Appl. No.: 09/114,854

[22] Filed: Jul. 14, 1998

Related U.S. Application Data

[62] Division of application No. 08/630,689, Apr. 12, 1996, Pat. No. 5,811,849.

[30] Foreign Application Priority Data

Sep. 21, 1995 [JP] Japan .................................. 7-243014

[51] Int. Cl.$^6$ .............................................. H01L 27/108
[52] U.S. Cl. .......................... 438/622; 438/622; 438/623; 438/626; 438/761; 438/780; 438/787; 438/790; 438/329; 438/253; 438/256; 438/257; 438/396
[58] Field of Search ............................ 438/622, 623–626, 438/761, 780, 787–790, 253, 256, 257, 329, 396, 399

[56] References Cited

U.S. PATENT DOCUMENTS

| | | |
|---|---|---|
| 5,212,114 | 5/1993 | Grewal et al. . |
| 5,364,811 | 11/1994 | Ajika et al. . |
| 5,406,103 | 4/1995 | Ogawa ..................................... 257/306 |
| 5,486,712 | 4/1994 | Arima ..................................... 257/296 |
| 5,519,237 | 6/1994 | Itoh et al. ................................. 257/306 |
| 5,532,956 | 2/1995 | Watanabe ................................ 257/303 |
| 5,608,248 | 6/1995 | Ohno ..................................... 257/306 |

FOREIGN PATENT DOCUMENTS

| | | |
|---|---|---|
| 0 416 165 | 3/1991 | European Pat. Off. . |
| 0 440 154 | 8/1991 | European Pat. Off. . |
| 41 13 233 | 10/1991 | Germany . |
| 59-98726 | 6/1984 | Japan . |
| 3-27527 | 2/1991 | Japan . |
| 5-182918 | 7/1993 | Japan . |
| 6-213829 | 8/1994 | Japan . |
| 6-349747 | 12/1994 | Japan . |
| WO 94/01885 | 1/1994 | WIPO . |

OTHER PUBLICATIONS

Technical Digest of IEDM '94, Novel Self–planarizing CVD Oxide for Interlayer Dielectric Applications M.Matsuura, et al, (4 pages).
Proceedings of DUMIC '95, "Planarization for Sub–micron Device utilising a New Chemistry" A. Kiemasz, et al pp. 94–100.
A. Kiermasz, et al., 1995 DUMIC Conference, pp. 94–100, Feb. 21 and 22, 1995, "Planarisation for Sub–Micron Devices Utilising a New Chemistry".

*Primary Examiner*—Charles Bowers
*Assistant Examiner*—Thanh Nguyen
*Attorney, Agent, or Firm*—Oblon, Spivak, McClelland, Maier & Neustadt, P.C.

[57] ABSTRACT

A silicon oxide film is formed on a wire array by CVD employing a gas mixture composed of a gas containing silicon atoms and hydrogen peroxide, and the thickness of the silicon oxide film in the region apart from the wire array is formed to be at least 50% of the wire thickness. Planarization of the silicon oxide film over the wire array region is attained.

20 Claims, 15 Drawing Sheets

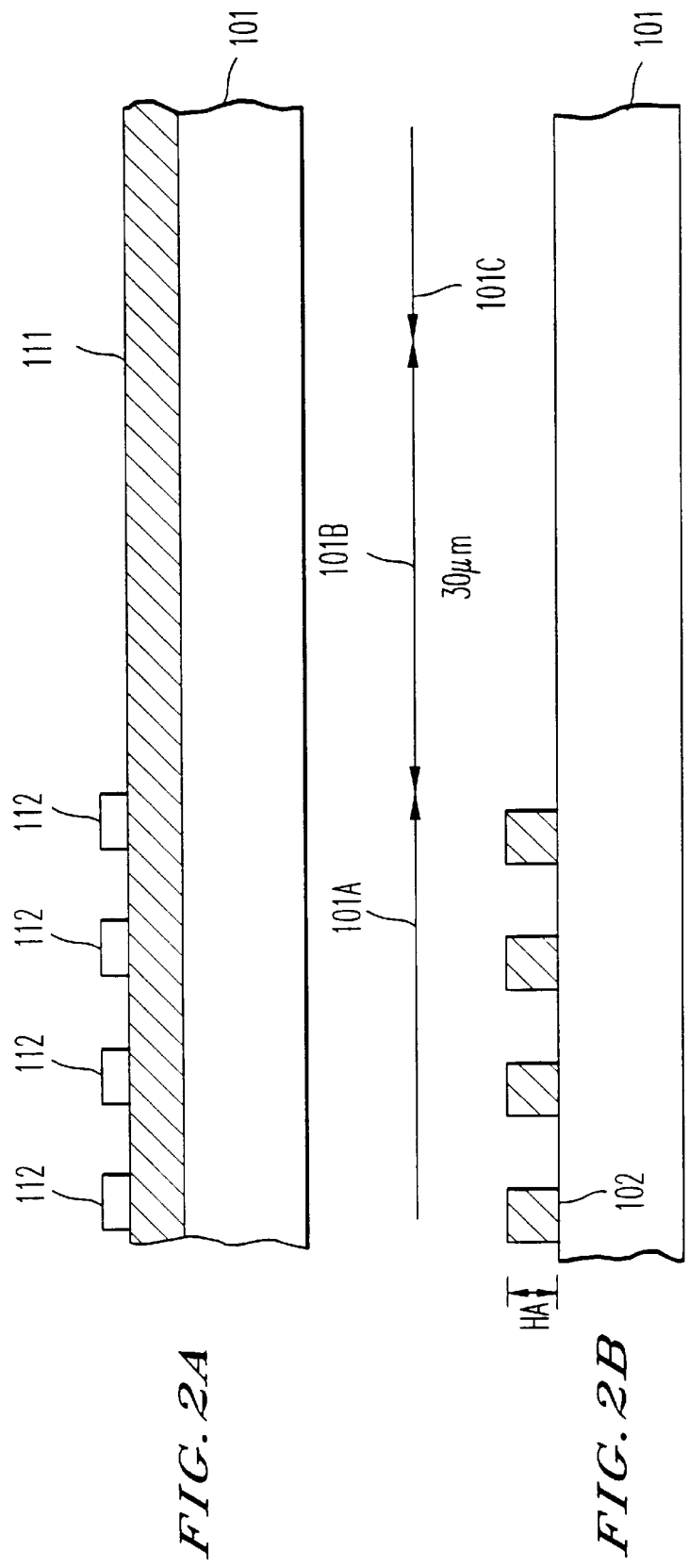

SEMICONDUCTOR MANUFACTURING PROCESS WITH OXIDE FILM FORMED ON AN UNEVEN SURFACE PATTERN

This application is a division of application Ser. No. 08/630,689 filed on Apr. 12, 1996, U.S. Pat. No. 5,811,849.

BACKGROUND OF THE INVENTION

1. Field of the Invention

The present invention relates to a semiconductor device and to a manufacturing process thereof and, more particularly, to a semiconductor device in which a silicon oxide film formed on an uneven pattern is planarized and to a manufacturing process thereof including a step of planarizing the silicon oxide film.

2. Description of the Related Art

At present, various types of semiconductor devices such as microcomputers, memories, and gate arrays are incorporated in many kinds of electric appliances including personal computers, work stations, etc. In these semiconductor devices, a plurality of elements such as transistors are integrated in a semiconductor substrate, and signal wires connecting these elements are almost necessarily multilayered. Accordingly, there is insulation between an element formed on the semiconductor substrate and a signal wire formed in an upper layer of the device consisting of an insulating layer formed on the element. There is also insulation between the signal wire and another signal wire formed on a further upper layer consisting of an insulating layer formed on the signal wire of the lower layer. Most of the insulating layers under the signal wires of both upper and lower layers are made of silicon oxide films, and planarity of the films is an essential requirement. This is because the formation of signal wires requires a series of photolithographic processes which includes forming a signal wire material on the surface of a silicon oxide film serving as an insulating layer, applying a resist thereon, irradiating the resist with light using a mask, etching the irradiated resist to leave resist only in the signal wire pattern, and further etching the signal wire material using the etched resist as a mask. Accordingly, there is a disadvantage in that a step difference in an insulating layer under a signal wire causes the signal wire formed on the insulating layer and further the resist formed thereon to create similar step differences. Therefore, projected light gets out of focus and the resist is not etched in the desired pattern, which may cause a short circuit between adjacent signal wires or an open in a signal wire.

For example, FIG. 16 shows a conventional semiconductor device, disclosed in the Japanese Laid-Open Patent Publication (unexamined) Hei 4-213829, which includes a semiconductor wafer 1 having grooves 2 in a main surface of the semiconductor wafer 1, wires 3 formed on the main surface, an oxide layer 4 formed on the semiconductor wafer 1 in the grooves 2 and over the wires 3 employing tetraethylorthosilicate (TEOS) and ozone ($O_3$) under a prescribed pressure, and an oxide layer 5 formed on the oxide layer 4 employing TEOS and ozone under a pressure lower than the prescribed pressure applied during forming the oxide layer 4.

Another Japanese Laid-Open Patent Publication (unexamined) Sho 59-98726 discloses that a silicon oxide film is formed employing silane ($SiH_4$), $SiHCl_3$ and hydrogen peroxide ($H_2O_2$), and another Japanese Laid-Open Patent Publication (unexamined) Hei 6-349747 discloses that when forming a silicon oxide film employing TEOS and hydrogen peroxide, desirable step coverage is achieved. Further, Japanese Laid-Open Patent Publication (unexamined) Hei 5-182918 discloses that when forming a silicon oxide film employing tetraethoxysilane ($Si(OC_2H_5)_4$) as an organic silane and hydrogen peroxide, a step coverage superior to that of employing ozone instead of hydrogen peroxide is achieved.

A silicon oxide layer formed by CVD (Chemical Vapor Deposition) employing a silicon compound such as silane and hydrogen peroxide can fill an extremely fine gap between two wires (0.25 $\mu$m or less, for example), and shows a superior fluidity and a self-planarizing character. Therefore CVD has come to attract a great deal of attention as a next-generation method of forming planarized insulating layers in place of the conventional SOG (Spin On Glass) method or the like. This was reported in "NOVEL SELF-PLANARIZING CVD OXIDE FOR INTERLAYER DIELECTRIC APPLICATION" (Technical Digest of IEDM 1994) and also in "PLANARIZATION FOR SUB-MICRON DEVICES UTILIZING A NEW CHEMISTRY" (Proceedings of DUMIC Conference 1995).

In the conventional semiconductor device as shown in FIG. 16, an oxide layer is formed employing TEOS and ozone, as mentioned above, and therefore a problem exists in that irregularity in coverage of the oxide layers 4 and 5 in the vicinity of the wires 3 is excessively large. In other words, the step coverage for oxide layers 4 and 5 is inadequate. Another problem exists in that when oxide layers 4 and 5 of almost equal thickness are respectively formed on the semiconductor wafer 1 and the wires 3 and, as a result, the step difference 7 on the upper face of the oxide layer 5 is as much as the height of the wires 3.

FIG. 17 shows an experimental result of forming an oxide layer employing silane and hydrogen peroxide instead of TEOS and ozone to overcome the mentioned problems. In FIG. 17, a semiconductor device includes a semiconductor substrate 11, aluminum wires 12 and silicon oxide film 13 formed on the semiconductor substrate 11, and an oxide layer 14 formed on the silicon oxide film 13 by CVD employing silane and hydrogen peroxide. It was acknowledged that the concave depth is large (so that the occurrence of inadequate planarization is greater) at the peripheral part as compared with the internal part of the wire formation region 15 where the aluminum wires 12 are formed.

The following is an explanation for the inadequate planarization. Silanol ($Si(OH)_4$) of low viscosity and superior fluidity is produced from silane and hydrogen peroxide by the following chemical reactions:

$$SiH_4 + 2H_2O_2 \longrightarrow Si(OH)_4 + 2H_2 \quad (1\text{-}1)$$

$$SiH_4 + 3H_2O_2 \longrightarrow Si(OH)_4 + 2H_2O + H_2 \quad (1\text{-}2)$$

$$SiH_4 + 4H_2O_2 \longrightarrow Si(OH)_4 + 4H_2O + 2H_2 \quad (1\text{-}3)$$

Silanol undergoes a reaction of dehydrating polymerization due to hydrolysis or thermal energy, and a silicon oxide film ($SiO_2$) is produced in the following manner:

$$nSi(OH)_4 \rightarrow nSiO_2 + 2nH_2O \quad (2)$$

The silicon oxide produced with silanol of high fluidity in this manner fills an extremely fine gap between the wires (i.e., sufficient step coverage is achieved), resulting in superior self-planarizing characteristics. However, fluidity of the silanol occurring at the end portion of the region 15 is deficient, producing inadequate gap filling between the wires 12 eventually resulting in inadequate planarization.

SUMMARY OF THE INVENTION

The present invention was made to solve the above-discussed problem and it is a primary object of the invention to provide a semiconductor device and a manufacturing process thereof in which planarization of silicon oxide insulating layers formed by CVD employing a silicon compound such as silane and hydrogen peroxide is achieved as designed even at an end portion of a wire formation region.

To accomplish the foregoing and other objects, and in accordance with the purposes of the invention, a semiconductor device is provided which comprises a plurality of wires formed on a first region of a semiconductor substrate and having a prescribed thickness, and a silicon oxide film is formed continuously on said first region on which said wires are formed, on a second region of the semiconductor substrate surrounding the first region and on a third region of the semiconductor substrate surrounding the second region. The silicon oxide film is formed employing a gas mixture composed of a gas containing silicon atoms and hydrogen peroxide, and further the silicon oxide film is formed in such a way that the film thickness thereof is gradually smaller in the second region in proportion to the distance from the first region, and that the silicon oxide film is planarized in the third region. The film thickness is at least 50% of the thickness of the wires.

Another aspect of the invention is to provide a semiconductor device in which the wires are formed separated by a prescribed distance on a oxide film, and another oxide film is formed thereon as described above.

Another aspect of the invention is to provide a semiconductor device in which capacitors with an uneven cell plate having a prescribed step difference are formed on an oxide film, and another oxide film is formed thereon as described above.

Another aspect of the invention is to provide a semiconductor device in which bit line wires in a memory cell array separated by a prescribed distance and having a prescribed step difference are formed on an oxide film, and another oxide film is formed thereon as described above.

A further aspect of the invention is to provide a manufacturing process of a semiconductor device which comprises a step of forming a plurality of wires having a prescribed thickness on a first region of a semiconductor substrate and a step of forming a silicon oxide film continuously on the first region, on a second region of the semiconductor substrate surrounding the first region and on a third region of the semiconductor substrate surrounding the second region. The silicon oxide film is formed by a chemical gas phase growth method employing a gas mixture which includes a gas containing silicon atoms and hydrogen peroxide. The film thickness of the silicon oxide film is made to be gradually smaller in the second region in proportion to the distance from the first region, and to be planarized in the third region and at least 50% of the thickness of the wires.

A further aspect of the invention is to provide a manufacturing process of a semiconductor device in which the gas for forming the oxide film as stated above is a gas mixture composed of silane and hydrogen peroxide.

A further aspect of the invention is to provide a manufacturing process of a semiconductor device in which the gas for forming the oxide film as stated above is a gas mixture composed of disilane ($Si_2H_6$) and hydrogen peroxide.

A further aspect of the invention is to provide a manufacturing process of a semiconductor device in which the gas for forming the oxide film as stated above is a gas mixture composed of an organic silicon compound which contains organic group (or alkyl group), for example TEOS, and hydrogen peroxide.

In the semiconductor device of the present invention described above, the silicon oxide film covering a wire array is well planarized by making the thickness of the silicon oxide film in the peripheral region at least 50% or more of the thickness of the array wires.

In the manufacturing method according to the present invention, a semiconductor device, in which a silicon oxide film is well planarized over a wire array, can be manufactured by forming a silicon oxide film is using a gas mixture composed of a silicon atom containing gas and hydrogen peroxide so that the film thickness in the peripheral region is at least 50% of the thickness of the array wires.

Other and further objects, features and advantages of the invention will appear more fully from the following description.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2(*a*) and 2(*b*) are sectional views showing a manufacturing process of the semiconductor device according to the present invention.

DETAILED DESCRIPTION OF THE PREFERRED EMBODIMENTS

Figure 1:
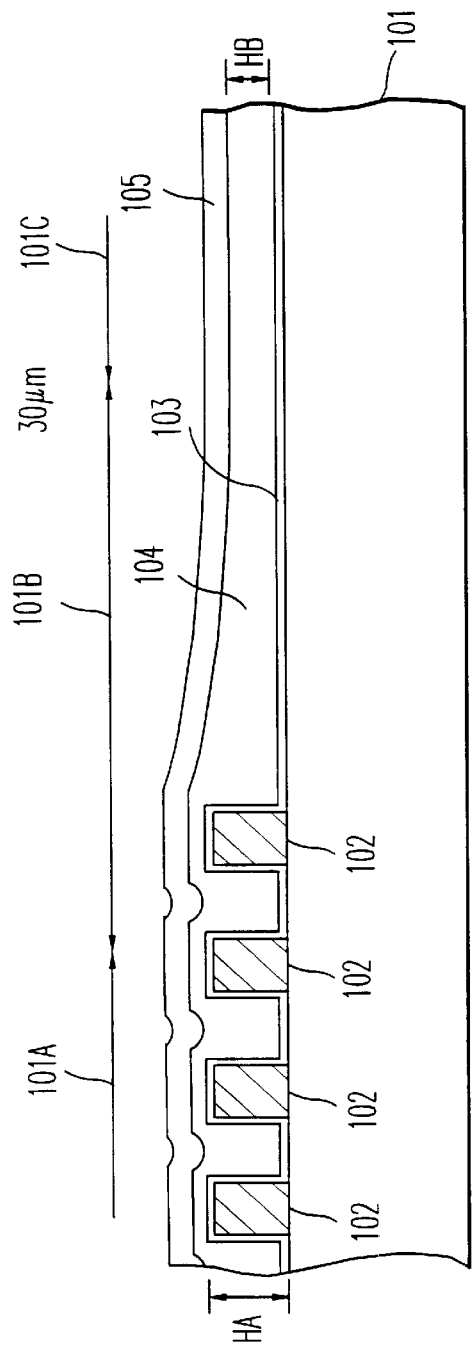
FIG. 1 is a sectional view showing a semiconductor device according to the present invention.

Referring now to the drawings, wherein like reference numerals designate identical or corresponding parts throughout the several views, and more particularly to FIG. 1 thereof, a semiconductor device of the present invention is shown. In FIG. 1, the semiconductor device includes a semiconductor substrate 101 made of, for example, silicon, having a first region 101a, a second region 101b, and a third region 101c. A plurality of wires 102 are respectively made of, for example, aluminum having a thickness HA (0.5 µm in this example) and formed on the first region 101a of the semiconductor substrate 101. The wires 102 may be formed separated by a predetermined distance and may be formed, at least partially, substantially in parallel. A plasma oxide film 103 made of silicon oxide of, for example, 1000 Å in thickness is formed by plasma CVD (Chemical Vapor Deposition) on the surface of the semiconductor substrate 101 on which the wires 102 are formed. A silicon oxide film 104 is formed on the first region 101a on which the wires 102 are formed, on the second region 101b surrounding the first region 101a and on the third region 101c surrounding the second region 101b by CVD employing a gas mixture composed of silane ($SiH_4$) and hydrogen peroxide ($H_2O_2$). The film thickness of the silicon oxide film 104 becomes gradually smaller in the second region 101b in proportion to the distance from the first region 101a, and the silicon oxide film 104 is planarized in the third region 101c distant (for example, 30 µm or more) from the first region 101a. The film thickness HB is at least 50% of the thickness HA of the wires 102. A plasma oxide film 105 is formed on the silicon oxide film 104 under the same or different conditions as those of the plasma oxide film 103.

Figure 3:
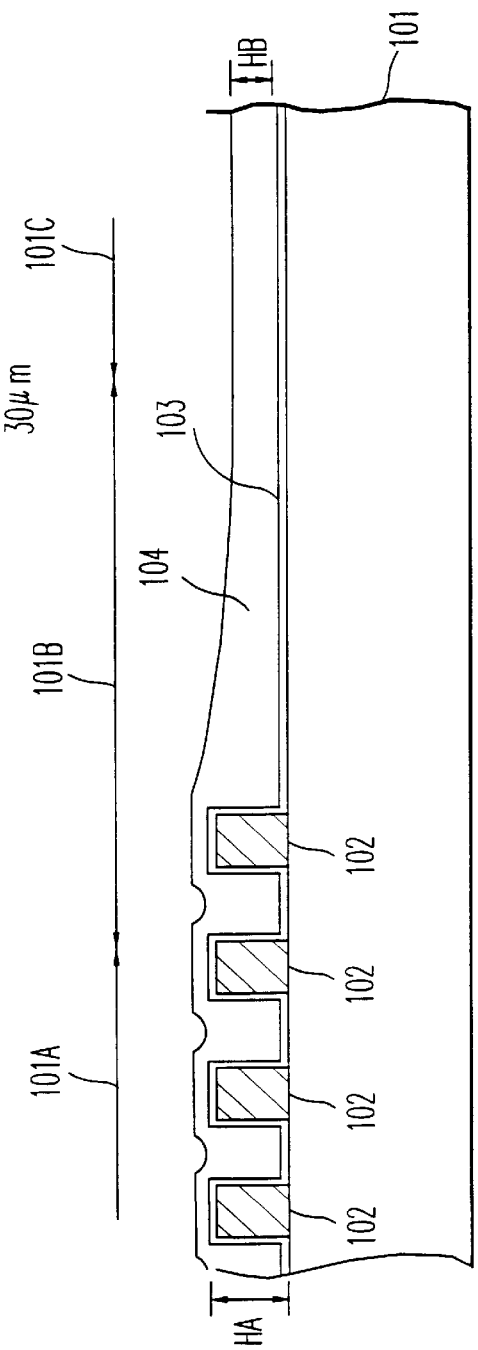
FIG. 3 is a sectional view showing a manufacturing process of the semiconductor device according to the present invention.

A manufacturing process of the semiconductor device shown in FIG. 1 is hereinafter described with reference to FIGS. 2 and 3. First, as shown in FIG. 2(a), an aluminum layer 111 is formed on the surface of a semiconductor substrate 101 by CVD or sputtering, and then a resist layer 112 is applied thereon. Only the parts of the resist 112 left after photolithography and etching are illustrated. Then, as shown in FIG. 2(b), aluminum layer 111 is subjected to anisotropic etching, utilizing the resist 112 as a mask, to form the wires 102, and the resist 112 is removed. As shown in FIG. 3, a plasma oxide film 103 of, for example, 1000 Å thickness is formed by plasma CVD either employing silane and dinitrogen monoxide ($N_2O$) as a raw material gas at a temperature of 300° C. under a pressure of 750 mTorr with a high frequency power of 500 W, or employing TEOS (tetraethylorthosilicate) and oxygen as a raw material gas at a temperature of 400° C. under a pressure of 5 Torr with a high frequency power of 500 W. Further, the silicon oxide film 104 is formed on the plasma oxide film 103 by CVD employing silane and hydrogen peroxide as raw a material gas such that film thickness is gradually smaller in the second region 101b in proportion to the distance from the first region 101a. The processing conditions are given as an example only and are not intended to limit the invention. Film 104 is planarized in the third region 101c distant (30 µm or more) from the first region 101a. The film thickness HB in the third region 101c is made at least 50% of the thickness HA of the wires 102.

To obtain the desired thickness pattern of the silicon oxide film 104, it is required to establish in advance film formation conditions of the silicon oxide film 104 such as a relation between film formation time and thickness of the silicon oxide film 104, and then form a film according to the film formation time preliminarily established. After forming the silicon oxide film 104, the plasma oxide film 105 (FIG. 1) is formed on the silicon oxide film 104 under the same or different conditions as those for the plasma oxide film 103, whereby the semiconductor device shown in FIG. 1 is formed.

Figure 4A:
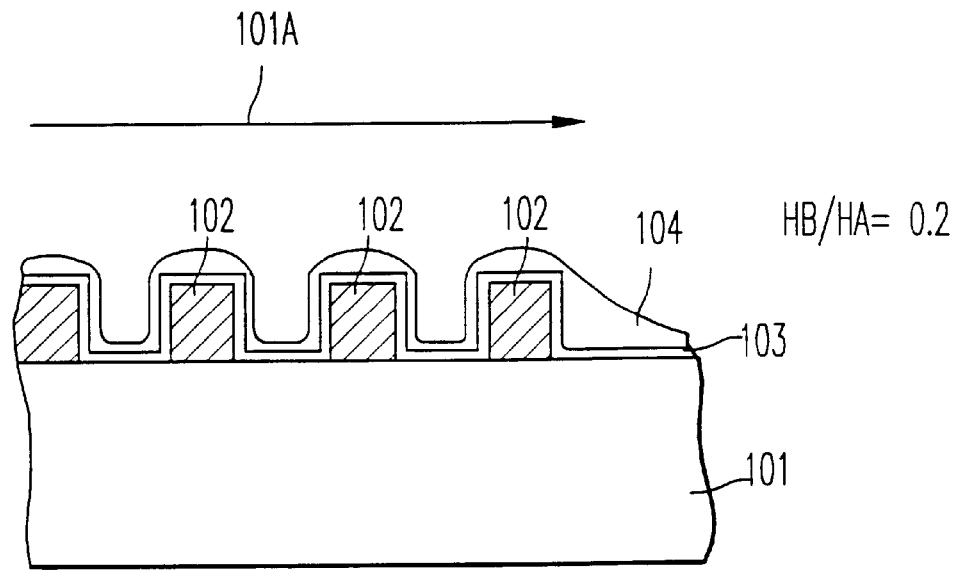
FIGS. 4(*a*) and 4(*b*) are sectional views showing samples for establishing the manufacturing conditions of the semiconductor device according to the present invention.
Figure 4B:
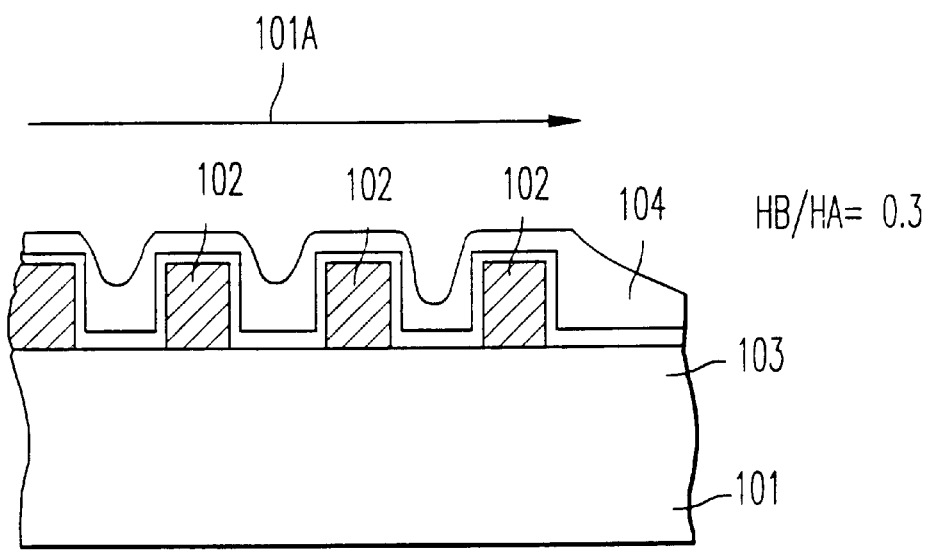

The gap filling characteristics of the silicon oxide film between the wires 102 depends upon the thickness HA of the wires 102 and the thickness HB of the silicon oxide film 104 located distant from a wire aggregate pattern. Several experiments were conducted varying the thickness HB of the silicon oxide film 104. Results of the experiments are hereinafter described with reference to FIGS. 4 and 5. FIG. 4(a) is a sectional view of a semiconductor device when the film formation time was set to five (5) seconds, and from which it is clearly understood that inadequate gap filling occurred between the wires 102. In this sample, a ratio HB/HA, i.e., the thickness HB of the silicon oxide film 104 on the third region to the thickness HA of the wires 102, was 0.2. FIG. 4(b) is a sectional view of a semiconductor device when the film formation time was set to ten (10) seconds. It is clearly understood that inadequate gap filling also occurred between the wires 102. In this sample, the ratio HB/HA was 0.3.

Figure 5A:
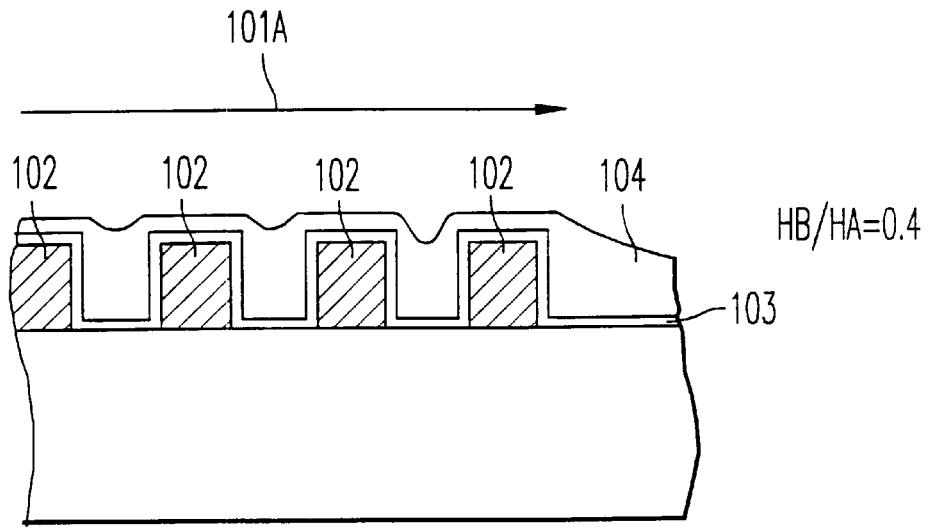
FIGS. 5(*a*) and 5(*b*) are sectional views showing samples for establishing the manufacturing conditions of the semiconductor device according to the present invention.
Figure 5B:
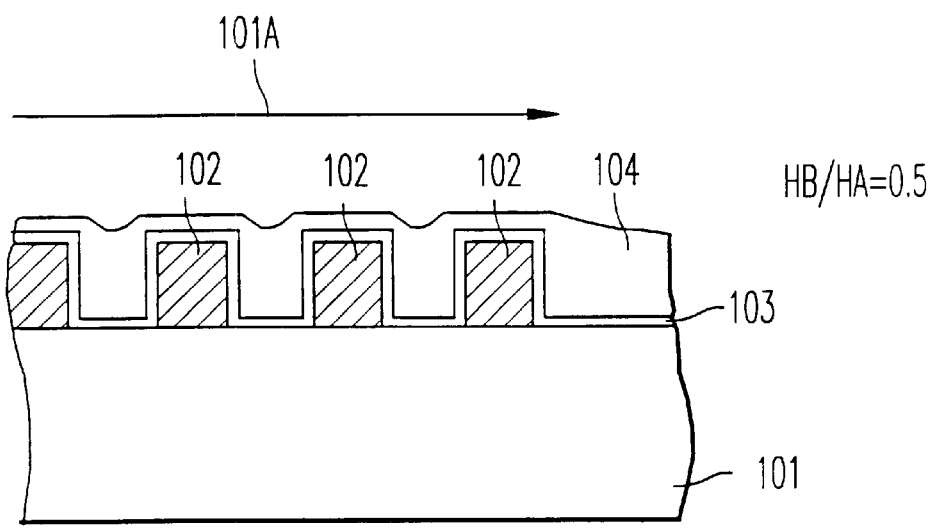

FIG. 5(a) is a sectional view of a semiconductor device when the film formation time was set to twenty (20) seconds, and from which it is clearly understood that inadequate gap filling still occurs between the wires 102 at the end portion of the first region 101a. In this sample, the ratio HB/HA was 0.4. FIG. 5 (b) is a sectional view of a semiconductor device when the film formation time was set to thirty (30) seconds. The gap filling was sufficient even at the end portion of the first region 101a. In this sample, HB/HA was 0.5.

As a result, it is understood from the above experiments that the gap filling of the silicon oxide film 104 between the wires 102 depends less upon the wire pattern when a longer time is taken in the film formation, resulting in improvement in step coverage. It is also understood that the gap filling between the wires 102 is delayed at the end portion of a wire pattern aggregate as compared with the internal part of the wire pattern aggregate. In order to ensure that the silicon oxide film, formed by CVD employing silane and hydrogen oxide as a raw material gas, is sufficiently planar on a variety of patterns without exhibiting inadequate gap filling, it is necessary that the film thickness HB of the silicon oxide film 104 distant from the pattern aggregate is 50% or more of the step difference HA of the wire pattern.

As described above, since the thickness HB of the silicon oxide film 104 in the third region 101c is made to be 50% or more of the thickness HA of the wires 102, sufficient planarization of the silicon oxide film 104 is attained in the first region 101a where the wire pattern is formed.

Next, the second embodiment of the invention is hereinafter described. In this embodiment, the method of forming a silicon oxide film is different from the foregoing embodiment. In this embodiment, the silicon oxide film 104 is formed by CVD employing disilane and hydrogen peroxide as a raw material gas. When employing disilane, the reaction formulas are as follows:

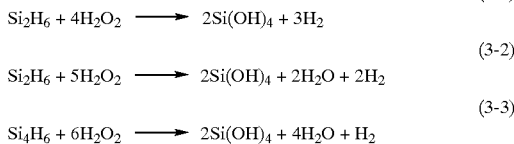

(3-1) $Si_2H_6 + 4H_2O_2 \longrightarrow 2Si(OH)_4 + 3H_2$ (3-2) $Si_2H_6 + 5H_2O_2 \longrightarrow 2Si(OH)_4 + 2H_2O + 2H_2$ (3-3) $Si_4H_6 + 6H_2O_2 \longrightarrow 2Si(OH)_4 + 4H_2O + H_2$ In the same manner as employing silane, silanol of superior fluidity is produced first, and then a silicon oxide is produced as described in the previous formula (2). The remainder of the process according to the second embodiment is the same as in the foregoing embodiment.

Also in this embodiment, the thickness HB of the silicon oxide film 104 in the third region 101c is established to be 50% or more of the thickness HA of the wires 102 in the same manner as the foregoing embodiment, and consequently planarization of the silicon oxide film 104 is achieved in the first region 101a on which the wires 102 are formed.

Still another embodiment of the invention is hereinafter described. This embodiment is different from the foregoing embodiments in the aspect that the silicon oxide film 104 is formed by CVD employing an organic silicon compound which contains an organic group (or alkyl group), for example TEOS, and hydrogen peroxide $H_2O_2$ as a raw material gas. When employing TEOS, the reaction formula is as follows:

$$Si(OC_2H_5)_4 + 4H_2O_2 \rightarrow Si(OH)_4 + X \qquad (4)$$

where: X indicates by-products such as $H_2O$, $CO_2$.

In the same manner as employing silane or disilane, silanol of superior fluidity is first produced, and a silicon oxide is produced as shown in the previous formula (2). Other steps in the manufacturing process are the same as in the foregoing embodiments.

Also in this embodiment, the thickness HB of the silicon oxide film 104 in the third region 101c is established to be 50% or more of the thickness HA of the wires 102 in the same manner as the foregoing embodiments, resulting in planarization of the silicon oxide film 104 in the first region 101a where the wire patterns 102 are located.

Figure 6:
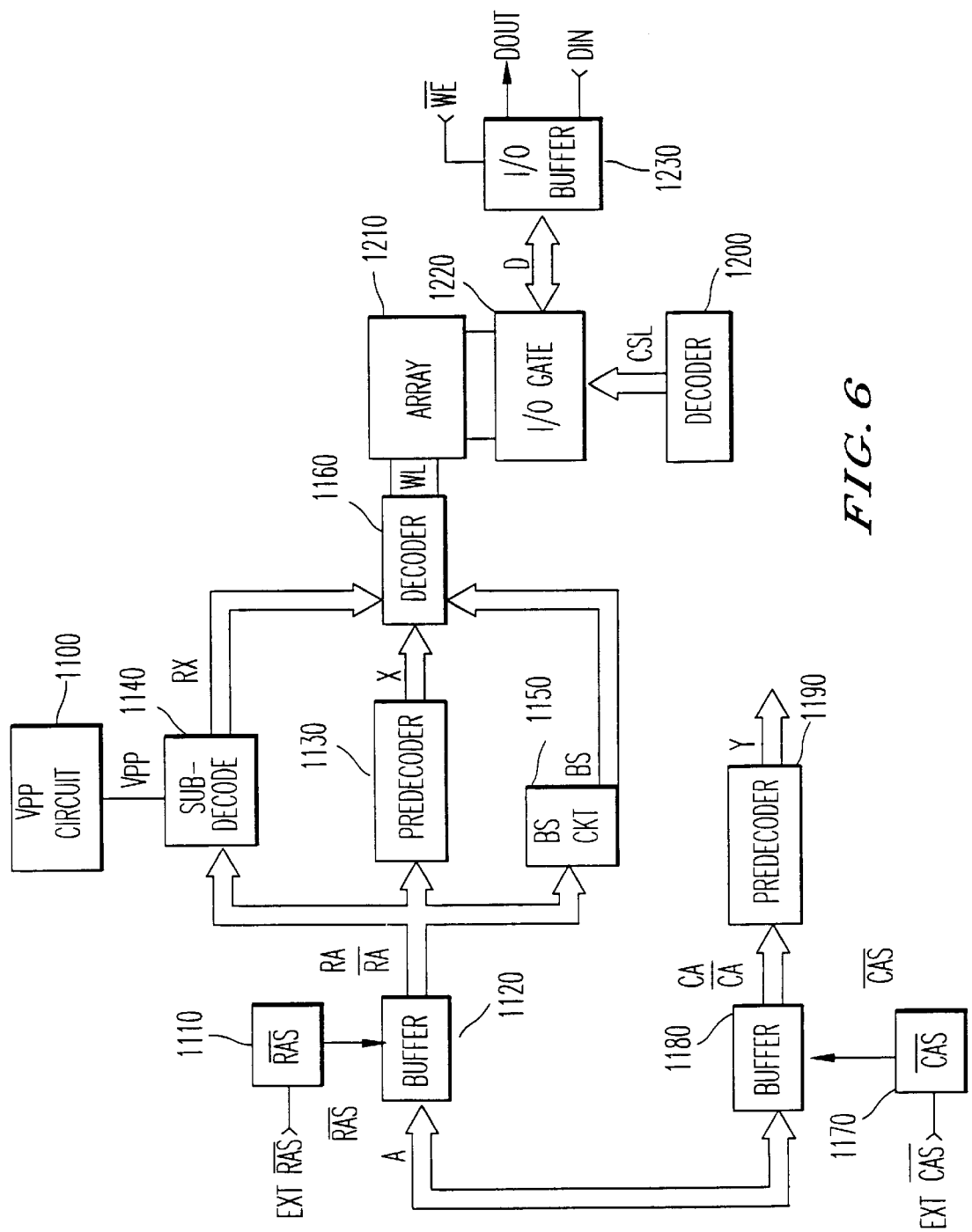
FIG. 6 is a block diagram showing a DRAM according to the present invention.

Still another embodiment of the invention is hereinafter described with reference to FIGS. 6–15. FIG. 6 is a block diagram of a DRAM (Dynamic Random Access Memory) on which the invention is applied. In the drawing, the DRAM is constituted as follows. An elevated potential generating circuit 1100 receives a source potential VCC (3.3V, for example) and outputs an elevated potential VPP higher than the source potential VCC. $\overline{RAS}$ buffer 1110 receives a row address strobe signal ext $\overline{RAS}$ from outside and outputs an internal row address strobe signal $\overline{RAS}$. A row address buffer 1120 receives the internal row address strobe signal $\overline{RAS}$ from the $\overline{RAS}$ buffer 1110 and an address signal Ai from the outside, and outputs the RAi and $\overline{RAi}$ signals, inputting the address signal Ai as a row address signal when $\overline{RAS}$ falls to an L level.

A row predecoder 1130 receives the row address RAi, $\overline{RAi}$ from the row address buffer 1120 and outputs a row predecoding signal Xi corresponding to the row address RAi, $\overline{RAi}$. A row subdecoder 1140 receives the elevated potential VPP from the elevated potential generating circuit 1100, and inputs a part of the row address RAi, $\overline{RAi}$ from the row address buffer 1120 and outputs the corresponding word line drive signal RXm. A block selecting circuit 1150 receives a part of the row address RAi, $\overline{RAi}$ from the row address buffer 1120 and outputs a corresponding block selection signal BSn.

A row decoder 1160 receives the row predecoding signal Xi from the row predecoder 1130, the word line drive signal RXm and the block selection signal BSn from the block selecting circuit 1150, and raises the potential of word line WL to the elevated potential VPP selectively among the plurality of word lines corresponding to those received signals. $\overline{CAS}$ buffer 1170 receives a column address strobe signal ext $\overline{CAS}$ from the outside and outputs an internal column address strobe signal $\overline{CAS}$. A column address buffer 1180 receives the internal column address strobe signal $\overline{CAS}$ from the $\overline{CAS}$ buffer 1170 and the address signal Ai from the outside, and outputs CAi, $\overline{CAi}$ signals, inputting the address signal Ai as a column address when $\overline{CAS}$ falls to an L level. A column predecoder 1190 receives the column address CAi, $\overline{CAi}$ from the column address buffer 1180 and outputs a column predecoding signal Yi corresponding to the column address CAi, $\overline{CAi}$. A column decoder 1200 receives the column predecoding signal Yi from the column predecoder 1190 and raises the potential of a column selection line CSL to an H level (VCC) selectively among the plurality of column selection lines corresponding to the column predecoding signal Yi.

A memory cell array 1210 includes a plurality of memory cells disposed to form a plurality of rows and a plurality of columns, a plurality of word lines disposed corresponding to each row and connected to the memory cells in a corresponding row, and a plurality of bit line pairs connected to the memory cells disposed in a corresponding column. A sense amplifier and I/O gate circuit 1220 includes a sense amplifier which, being connected to each bit line pair, detects and amplifies the potential difference between the connected bit lines, and an I/O gate circuit which connects a bit line pair of the column selected by the column decoder 1200 to an I/O line pair. An I/O buffer 1230 receives a write enable signal $\overline{WE}$ and, when the write enable signal $\overline{WE}$ is at the L level, data Din inputted from the outside is written in the memory cell located at the address corresponding to the address signal through the I/O line pair. When the write enable signal $\overline{WE}$ is at the H level, data read out on the I/O line is outputted as Dout.

Figure 7:
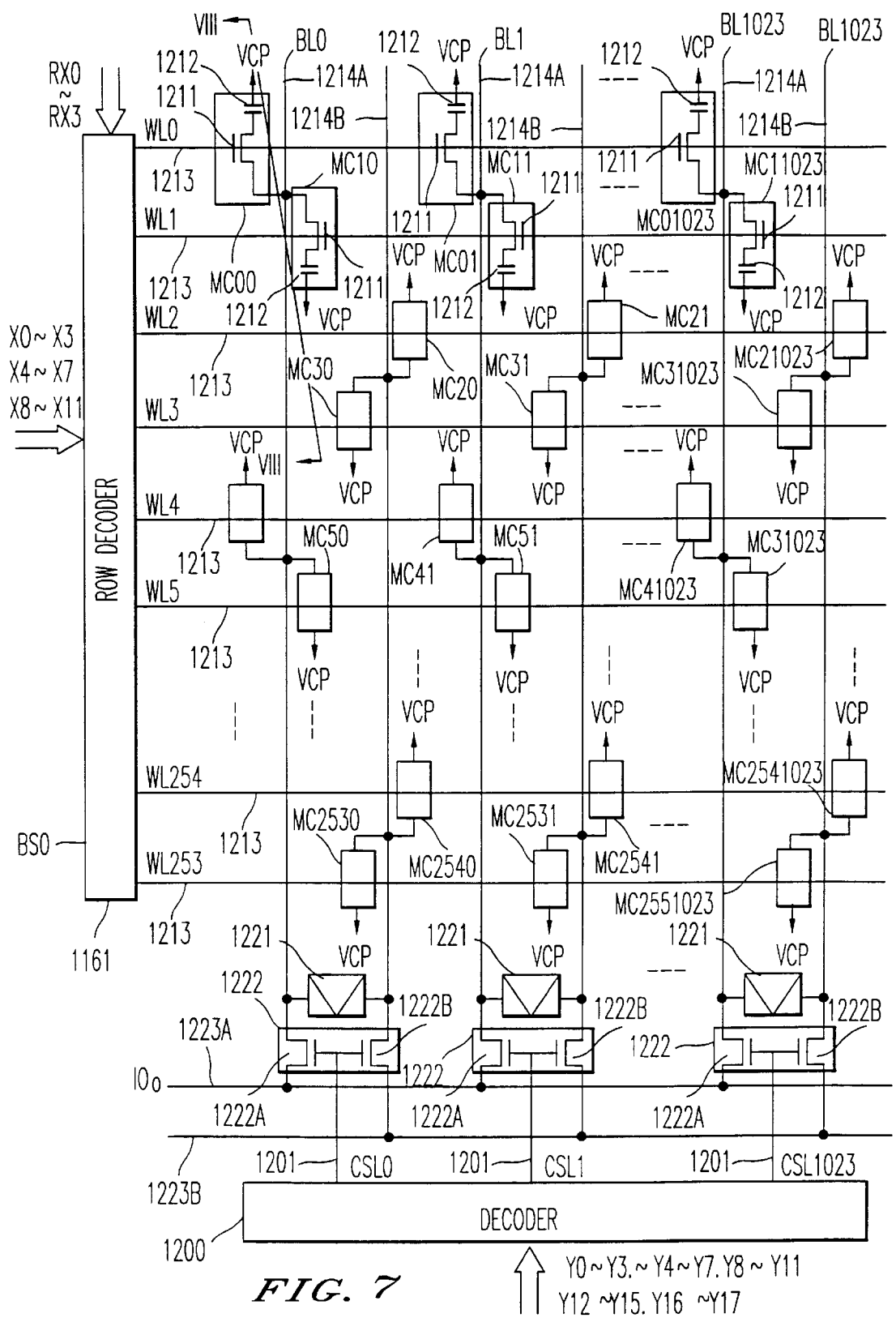
FIG. 7 is a circuit diagram showing the memory cell array area of the DRAM according to the present invention.

FIG. 7 is a block diagram showing a part of the memory cell array 1210 shown in FIG. 6 and a peripheral circuit thereof. More specifically, FIG. 7 shows one of sixteen (16) blocks forming one of four (4) memory mats of the memory cell array 1210. In FIG. 7, each memory cell MCxy (where x and y are integers) includes an n-channel MOS transistor 1211 and a capacitor 1212, and each memory cell MCxy is disposed corresponding to an intersection of a word line 1213 and a bit line pair 1214 comprising bit lines 1214a and 1214b. The n-channel MOS transistor 1211 in each memory cell MCxy utilizes a part of the word lines 1213 as a gate and is connected between one electrode of the capacitor 1212 and the bit line 1214a or 1214b. A cell plate potential VCP, being an intermediate potential (½ of the source potential VCC, for example), is applied to another electrode of the capacitor 1212.

A row decoder 1161 receives one block selection signal BS0 among sixteen (16) block signals BS0 to BS15 corresponding to sixteen (16) blocks, and, when the received block selection signal BS0 is activated to the H level, raises selectively one word line 1213 among 256 word lines to the elevated potential VPP, corresponding to three groups of row predecoding signals $X_0$–$X_3$, $X_4$–$X_7$, $X_8$–$X_{11}$, one of which is activated to the H level, and corresponding to four word line drive signals $RX_0$–$RX_3$, one of which is activated to the H level, respectively in response to the row address signal RAi.

A column decoder 1200 activates one of 1024 column selection lines 1201 to the H level corresponding to column predecoding signal $Y_0$–$Y_3$, $Y_4$–$Y_7$, $Y_8$–$Y_{11}$, $Y_{12}$–$Y_{15}$, $Y_{16}$–$Y_{19}$. The column decoder 1200 is commonly used by the 16 blocks. A sense amplifier 1221 is connected between the bit lines 1214a and 1214b to detect and amplify a potential difference between bit lines 1214a and 1214b. Each I/O gate 1222 is connected between the bit line pair 1214 and I/O line pair 1223, and receives a column selection signal CSLi from the column selection line 1201 of the corresponding column, and electrically connects the bit line pair 1214 to the corresponding I/O line 1223, when the column selection signal CSLi is at the H level. Each I/O gate comprises an n-channel MOS transistor 1222a connected between the bit line 1214a and an I/O line 1223a and another n-channel MOS transistor 1222b connected between the bit line 1214b and an I/O line 1223b. The gates of transistors 1222a and 1222b are connected to the column selection line 1201.

Figure 8:
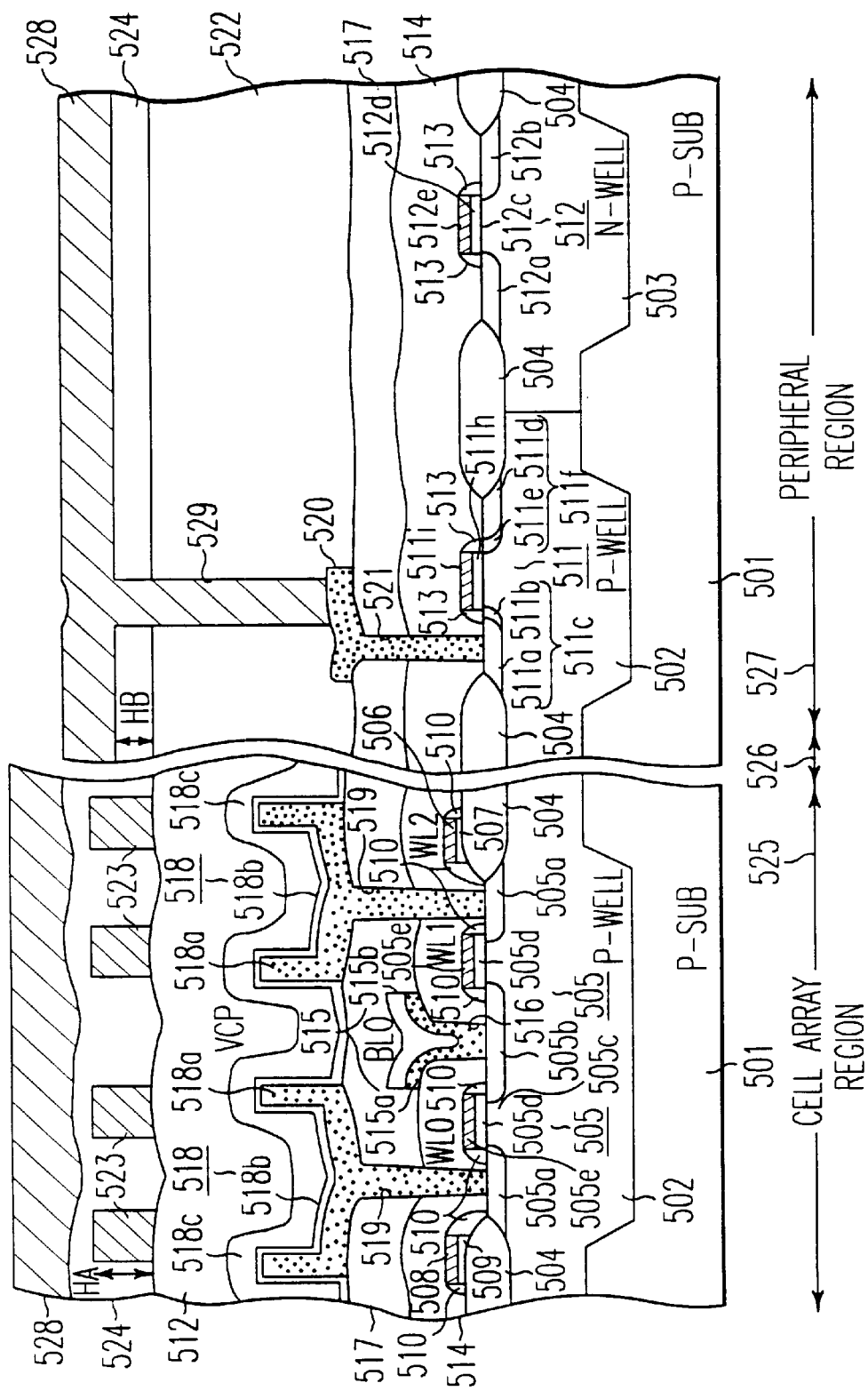
FIG. 8 is a sectional view showing the DRAM according to the present invention.

FIG. 8 is a sectional view showing together a section taken in the line VIII—VIII in a manufactured semiconductor device incorporating the memory cell MCxy shown in FIG. 7 and a section of a peripheral circuit of the memory cell array 1210 such as a row decoder 1161 and a sense amplifier 1221. The region where the peripheral circuit is formed is distant from the region of the memory cell array 1210 by, for example, 30 μm. In FIG. 8, the semiconductor device comprises a p-type silicon semiconductor substrate 501, a p-well 502 formed in the semiconductor substrate 501 and having higher impurity concentration than the semiconductor substrate 501, an n-well 503 formed in the semiconductor substrate 501, an element isolation region 504 of insulating material (silicon oxide in this example) formed on the principal plane of the semiconductor substrate 501 and isolating the MOS transistors 511 and 512 formed on the semiconductor substrate 501, and n-channel MOS transistors 505 formed in the p-well 502. In the drawing, the left side corresponds to the n-channel MOS transistor 1211 in the memory cell MC00 and the right side corresponds to the n-channel MOS transistor 1211 in the memory cell MC10. The n-channel MOS transistors 505 comprise one n-type source/drain 505a formed in the p-well 502, another n-type source/drain 505b formed isolated from the source/drain 505a, and gate electrode 505e formed facing channel region 505c through a gate insulating film 505d between the two source/drains 505a and 505b. Each gate electrode 505e is a part of the parallel word line 1213 respectively corresponding to the word line potentials $WL_0$, $WL_1$.

The word line 506 corresponds to the word line WL2 in FIG. 7, a part of which serves as a gate electrode of the n-channel MOS transistor 1211 in the memory cell MC20 (not shown in FIG. 8) in the same way as the gate electrode 505e. Word line 506 is formed on an insulating film 507 serving as a gate insulating film of the n-channel MOS transistor 1212 in the memory cell MC20. A word line 508 works as a dummy word line not shown in FIG. 7 which cancels noise generated in a bit line at the time the word line potential is raised or works as a spare word line not shown in FIG. 7 substituting for any defective row of the memory cell array. A part of word line 508 serves as a gate electrode of the dummy cell or spare memory cell, and is formed on an insulating film 509 serving as a gate insulating film of the dummy cell or spare memory cell. A side wall insulating film 510 of a silicon oxide is formed on each side wall of the gate electrodes or word lines 505e, 506, 508.

N-channel MOS transistor 511 in a peripheral circuit includes a source/drain 511c formed in the p-well 502 comprised of n+ region 511a and n region 511b of lower impurity concentration than n+ region 511a, another source/drain 511f formed separated from the source/drain 511c in p-well 502 comprised of n+ region 511d and n region 511e of lower impurity concentration than n+ region 511d, and a gate electrode 511i facing channel region 511g through a gate insulating film 511h between the two source/drains 511c and 511f. A p-channel MOS transistor 512 in the peripheral circuit includes a p+ source/drain 512a formed in the n-well 503, another p+ source/drain 512b formed separated from the p+ source/drain 512a in n-well 503, and a gate electrode 512e facing channel region 512c through a gate insulating film 512d between the two source/drains 512a and 512b.

A side wall insulating film 513 of silicon oxide is formed on each side wall of the gate electrodes 511i and 512e. An interlayer insulating film 514 of BPSG (Boro-Phospo Silicate Glass) is formed over the surface in both of the memory cell array 1210 and the peripheral circuit. A bit line 515, in the memory cell region, is connected to another source/drain 505b of the n-channel MOS transistor 505 through a contact hole 516 provided in the interlayer insulating film 514. Bit line 515 is comprised of a connection part 515a of n-type polysilicon contacting the source/drain 505b and a low resistance part 515b of aluminum for reducing the resistance of the bit line 515. This bit line 515 corresponds to the bit line 1214a in FIG. 7.

An interlayer insulating film 517 of BPSG is formed on the surface of both the memory cell array 1210 and the peripheral circuit. A capacitor 518 is formed on the interlayer insulating film 517 in the memory cell array region. Left side capacitor 518 in FIG. 8 corresponds to the capacitor 1212 of the memory cell MC00 in FIG. 7 and the right side capacitor 518 corresponds to the capacitor 1212 of the memory cell MC10. Each capacitor 518 is comprised of one electrode 518a of n-type polysilicon which is connected to one source/drain 505a of the n-channel MOS transistors 505 through a contact hole 519 provided in the interlayers 514 and 517, a dielectric film 518b comprised of laminated layers of a silicon oxide film and a silicon nitride film formed on the electrode 518a, and a cell plate 518c composed of aluminum which is formed over the dielectric film 518b. Capacitor 518 is cylindrical in shape on the interlayer 517 (like a rotary member sectionally shown pivoted on the contact hole 519). Cell plate 518c is applied with a cell plate potential VCP and serves as another electrode of the capacitor 518.

A contact pad 520 of n-type polysilicon is formed, in the peripheral region, on the same layer as the electrode 518a of the capacitor 518 in the memory cell array region, and connected to the source/drain 511c of the n-channel MOS transistor 511 of the peripheral circuit through a contact hole 521 provided on the interlayer insulating films 514 and 517. An interlayer insulating film 522 of BPSG is formed over both the memory cell array 1210 and the peripheral circuit. A plurality of parallel shunt word lines 523 are disposed in parallel to the word lines 505e, 506, 508, and are connected to the word lines 505e, 506, 508 at a certain predetermined distance (for each 128 bit line pairs, for example), though not shown. Lines 523 are composed of aluminum for reducing the resistance of the word lines 505e, 506, 508, and have a thickness HA.

A silicon oxide film 524 is formed by CVD employing a gas mixture composed of silane and hydrogen peroxide over semiconductor substrate 501 including a memory cell array region 525 where the memory cell array 1210 is formed with the shunt word line 523, over a boundary region 526 of 30 µm or more in width surrounding the memory cell array region, and over a peripheral circuit region 527. The silicon oxide film 524 is formed by CVD employing a gas mixture composed of silane and hydrogen peroxide in such a way that the thickness of the silicon oxide film 524 is gradually smaller in the boundary region 526 in proportion to a distance from the memory cell array region 525, and the silicon oxide film 524 is planarized in the peripheral circuit region 527 distant (30 µm or more) from the memory cell array region 525. The film thickness HB is at least 50% of the thickness HA of the shunt word lines 523. A power supply line 528 composed of aluminum is formed on the silicon oxide film 524 for supplying a grounding potential GND to the source/drain 511c of the n-channel MOS transistor 511 of the peripheral circuit through the contact pad 520. Power supply line 528 is connected to the contact pad 520 via a contact hole 529 provided through the silicon oxide film 524 and interlayer insulating film 522.

In this manner, as a result of connecting the power source line 528 to the source/drain 511c of the n-channel MOS transistor 511 not directly but through the contact pad 520, there is no need to provide a contact hole through the interlayer insulating films 514, 517, 522 and silicon oxide film 524. In trying to provide such a deep contact hole, the diameter of the contact hole would need to be large and accordingly a large-sized source/drain 511c of the n-channel MOS transistor 511 must be formed, resulting in increased layout area. This problem is solved by forming two shallow contact holes 521 and 529.

As a result of forming the film thickness HB of the silicon oxide film 524 in the peripheral circuit region 527 to be 50% or more of the thickness HA of the shunt word lines 523, the silicon oxide film 524 in the memory cell array region 525 where the shunt word lines 523 are formed is well planarized. Moreover, the contact hole depths are reduced by decreasing the thickness HB to ½ that of the thickness HA, while maintaining the desired planarity.

Figure 9:
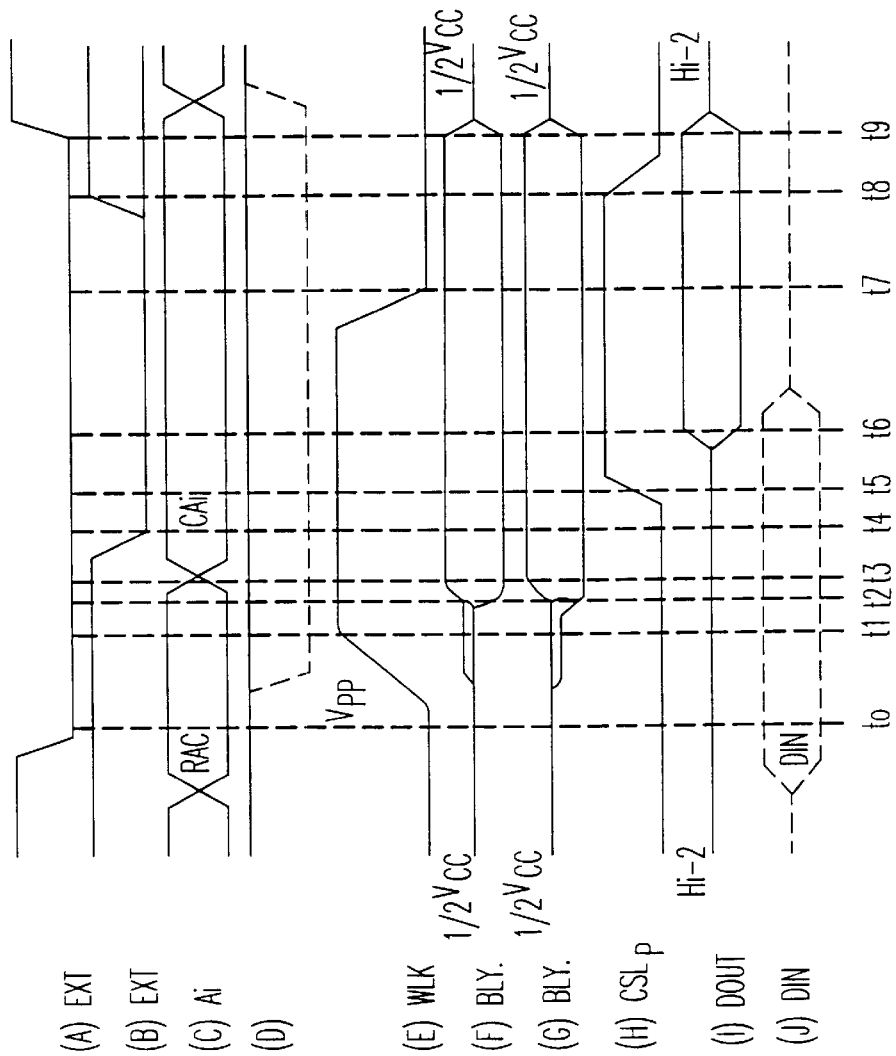
FIGS. 9(*a*)–9(*j*) are a timing chart showing the operation of the DRAM according to the present invention.

Operation of the DRAM constructed as described above according to this invention is hereinafter described with reference to FIG. 9. First, when the address signal Ai is given as shown in FIG. 9(c) and the external row address strobe signal ext $\overline{RAS}$ is caused to fall (i.e., activated) from the H level to the L level at the time $t_0$, as shown in FIG. 9(a), and the internal row address strobe signal $\overline{RAS}$ falls to the L level, the row address buffer 1120, in FIG. 6, inputs the given address signal Ai as the row address and outputs the row address signals RAi and $\overline{RAi}$ of the same logic as or reverse logic of the address signal Ai. Then, the row predecoder 1130 causes one of four of the three groups of predecoding signals $X_0$–$X_3$, $X_4$–$X_7$, $X_8$–$X_{11}$ to be H level according to the pair of the row address signals RAi, $\overline{RAi}$.

The row subdecoder 1140 causes one of the word line drive signals RX0–RX3 to rise to the elevated potential VPP according to the two row address signals RA0, $\overline{RA0}$, RA1, $\overline{RA1}$, and the block selection circuit 1150 causes one of the 16 block selection signals BS0–BS15 to be H level in accordance with the four row address signals RAi, $\overline{RAi}$. Then, the row decoder 1161 related to the H level block selection signal BSj in the row decoder 1160 causes the potential WLk of the word lines 1213 to rise to the elevated potential VPP at the time $t_1$ as shown in FIG. 9(e). As a result, n-channel MOS transistor 1211 in the memory cell MCky connected to the elevated word lines 1213 turns on, whereby charge is delivered between one electrode of the capacitor 1212 and the bit line 1214a or 1214b precharged beforehand to the intermediate potential (½ VCC).

At this time, if the source potential VCC is held on one electrode of the capacitor 1212, an electric charge flows from this electrode of the capacitor 1212 to the bit line 1214a or 1214b, and a potential BLy or $\overline{BLy}$ of the bit line 1214a or 1214b rises slightly from the intermediate potential (½ VCC) as shown in FIG. 9(f). On the other hand, if the ground potential GND is held on this electrode of the capacitor 1212, an electric charge flows from the bit line 1214a or 1214b to the capacitor 1212, and the potential BLy or $\overline{BLy}$ of the bit line 1214a or 1214b falls slightly from the intermediate potential (½ VCC) as shown in FIG. 9(g). Such a small potential difference between the bit lines is detected and amplified by the sense amplifier 1221 so that the potential of the lower potential bit line is adjusted to the ground potential GND at time $t_2$ and that the potential of the higher potential bit line is adjusted to the source potential VCC at time $t_3$, as shown in FIGS. 9(f) and 9(g).

Then, when an address signal Ai corresponding to a column address is given as shown in FIG. 9(c) and an external column address signal ext $\overline{CAS}$ is caused to fall from the H level to the L level (i.e., activated) at time $t_4$, an internal column address strobe signal $\overline{CAS}$ outputted from the $\overline{CAS}$ buffer 1170 also falls to the L level, whereby the column address buffer 1180 inputs the given address signal Ai as column address and outputs column address signals CAi, $\overline{CAi}$ of the same logic as or reverse logic of the address signal Ai. Then, the column predecoder 1190 causes each one of four of the five groups of column predecoding signals $Y_0$–$Y_3$, $Y_4$–$Y_7$, $Y_8$–$Y_{11}$, $Y_{12}$–$Y_{15}$, $Y_{16}$–$Y_{19}$ to be H level according to each two of the column address signals CAi, $\overline{CAi}$.

Then, the column decoder 1200 causes the potential CSLp of one selected line 1201 to rise to the H level at time $t_5$ corresponding to the column predecoding signals $Y_0$–$Y_3$, $Y_4$–$Y_7$, $Y_8$–$Y_{11}$, $Y_{12}$–$Y_{15}$, $Y_{16}$–$Y_{19}$ as shown in FIG. 9(h). As a result, the n-channel MOS transistors 1222a and 1222b in the I/O gate 1222 connected to the selected column line 1201 at the H level turn on, whereby the bit line pair 1214 and I/O line pair 1223 corresponding to the selected column line 1201 are mutually electrically connected. Complementary data IOn, $\overline{IOn}$ corresponding to the data stored in the selected memory cell MCkp are outputted to the I/O buffer 1230. I/O buffer 1230 outputs the output data Dout corresponding to those data at $t_6$ as shown in FIG. 9(i), thus readout being completed.

At the time of writing, the write enable signal $\overline{WE}$ falls to the L level and the input data Din is given as shown in FIG. 9(j) before the external column address strobe signal ext $\overline{CAS}$ to falls to the L level. As a result, one of the I/O lines 1223a and 1223b falls to the L level while another rises to the H level, and such L level or H level potential is transferred to one electrode of the capacitor in the selected memory cell MCkp through the I/O line pair 1223 and the bit line pair 1214 connected to the I/O line pair 1223 corresponding to the column address signals CAi, $\overline{CAi}$ by the column decoder 1200. When the potential of every word line 1213 has fallen to the L level and the external column address strobe signal ext $\overline{CAS}$ and external row address strobe signal ext $\overline{RAS}$ have risen to the H level, every gate 1222 is turned off, completing the read or write operation.

Figure 10A:
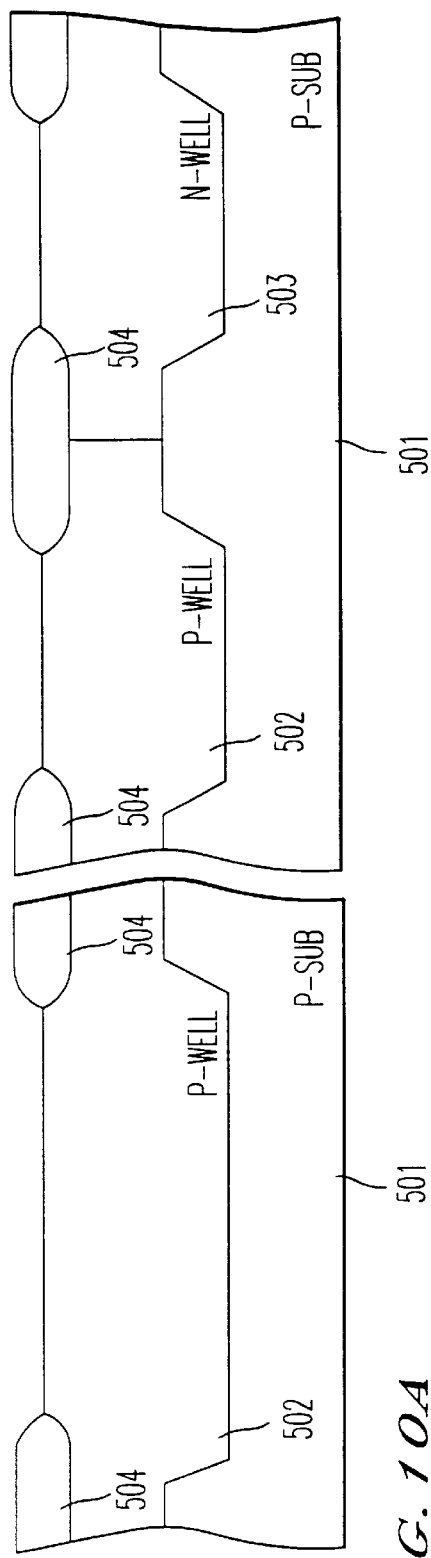
FIGS. 10(*a*) and 10(*b*) are sectional views showing a manufacturing process of the DRAM according to the present invention.

A manufacturing process of the DRAM as shown in FIG. 8 is hereinafter described with reference to FIGS. 10–13. First, as shown in FIG. 10(a), the element isolation regions 504 are selectively formed on a principal plane of the p-type semiconductor substrate 501 by LOCOS (Local Oxidation of Silicon). The p-well 502 of higher impurity concentration than the semiconductor substrate 501 is formed by doping the substrate with p-type ions such as boron while masking the n-well 503 formation region with resist utilizing photolithography. The resist masking the n-well 503 formation region is then removed. Next, the n-well 503 is formed by doping the substrate with n-type ions such as phosphorus while masking the p-well 502 with resist, utilizing photolithography. The resist is then removed.

Figure 10B:
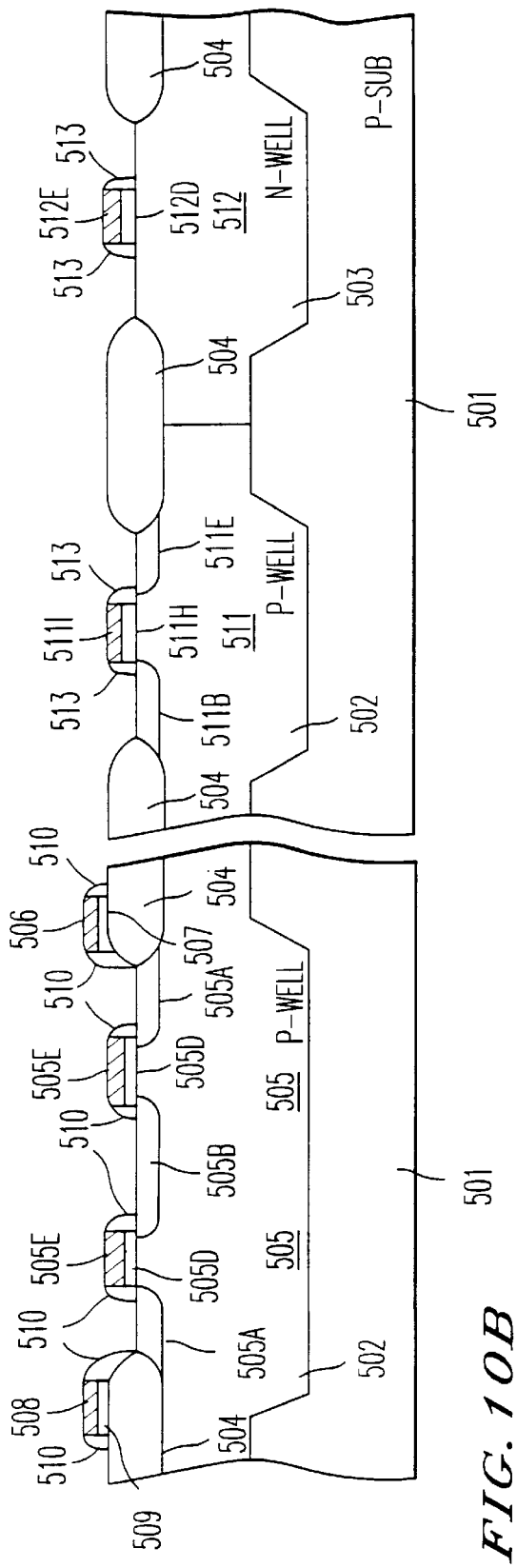

As shown in FIG. 10(*b*), a silicon oxide film serving as the gate insulating films 505*d*, 511*h*, 512*d* is formed by thermal oxidation on the region where MOS transistors 505, 511, 512 are formed, and an electrode layer composed of a conductive material such as polysilicon doped with an n-type impurity serving as gate electrodes or word lines 505*e*, 511*i*, 512*e*, 506, 508, is deposited by CVD on the silicon oxide film and the element isolation region 504. The gate electrodes or word lines 505*e*, 511*i*, 512*e*, 506, 508 are formed from the electrode layer by photolithography and etching. The gate electrodes 505*e*, 511*i*, 512*e* are then masked and the silicon oxide film is etched, leaving the gate insulating films 505*d*, 511*h*, 512*d*.

N-well 503 is masked with resist utilizing photolithography, and the source/drain regions 505*a* and 505*b* of the n-channel MOS transistors 505 and also the source/drain regions 511*b* and 511*e* of the n-channel MOS transistor 511 are formed by doping and selectively diffusing n-type ions such as arsenic. Then the resist masking the n-well 503 is removed, and a silicon oxide film is formed covering the gate electrode and word lines 505*e*, 506, 508, 511*i*, 512*e* by CVD. This oxide film is anisotropically etched to form side wall insulating films 510 and 513.

Figures 11A, 11B:
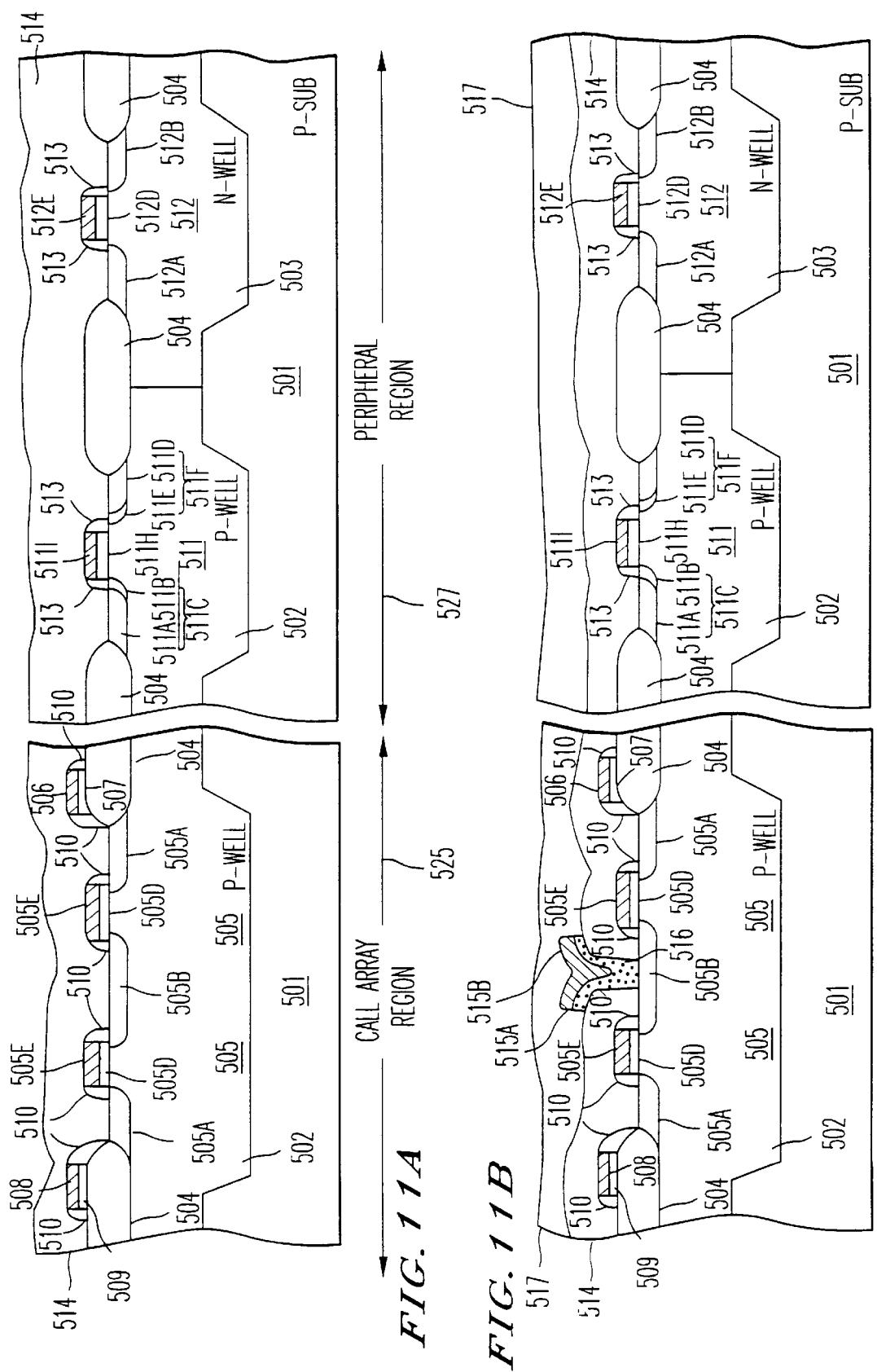
FIGS. 11(*a*) and 11(*b*) are sectional views showing the manufacturing process of the DRAM according to the present invention.

The memory cell array region 525 and the area of the peripheral circuit region 527 where the n-well 503 is formed, as shown in FIG. 11(*a*), is masked with resist utilizing photolithography, and the n+ regions 511*a*, 511*d* are formed by selectively doping and diffusing arsenic to have a higher doping concentration than that of the n regions 511*b* and 511*e* to form source or drain 511*c*, 511*f* of the n-channel MOS transistor 511. The resist masking the memory cell array region 525 and the area of the peripheral circuit region 527 where the n-well 503 is formed is then removed. The area of the memory cell array region 525 and of the peripheral circuit region 527 where the p-well 502 is formed is masked utilizing photolithography to form the source or drain 512*a*, 512*b* of the p-channel MOS transistor 512 by selectively doping and diffusing boron to have a higher doping concentration than that of the n-well 503. The resist masking the area of the memory cell array region 525 and of the peripheral circuit region 527 where the p-well 502 is formed is then removed. The interlayer insulating film 514 of BPSG is formed over the surface of the memory cell array region 525 and the peripheral circuit region 527 (FIG. 11(*a*)).

Then, as shown in FIG. 11(*b*), a contact hole 516 is provided in the interlayer insulating film 514 by photolithography and etching to the source/drain region 505*b*. An n-type polysilicon layer serving as the connection part 515*a* of the bit line 515 is formed by CVD in the contact hole 516 and on the interlayer insulating film 514, and an aluminum layer serving as the low resistance part 515*b* of the bit line 515 is formed on part 515*a* by CVD or sputtering. The connection part 515*a* and low resistance part 515*b* of the bit line 515 are etched to form the bit line 515. The interlayer insulating film 517 of BPSG is formed by CVD over the surface of the memory cell array region 525 and peripheral circuit region 527.

Figure 12:
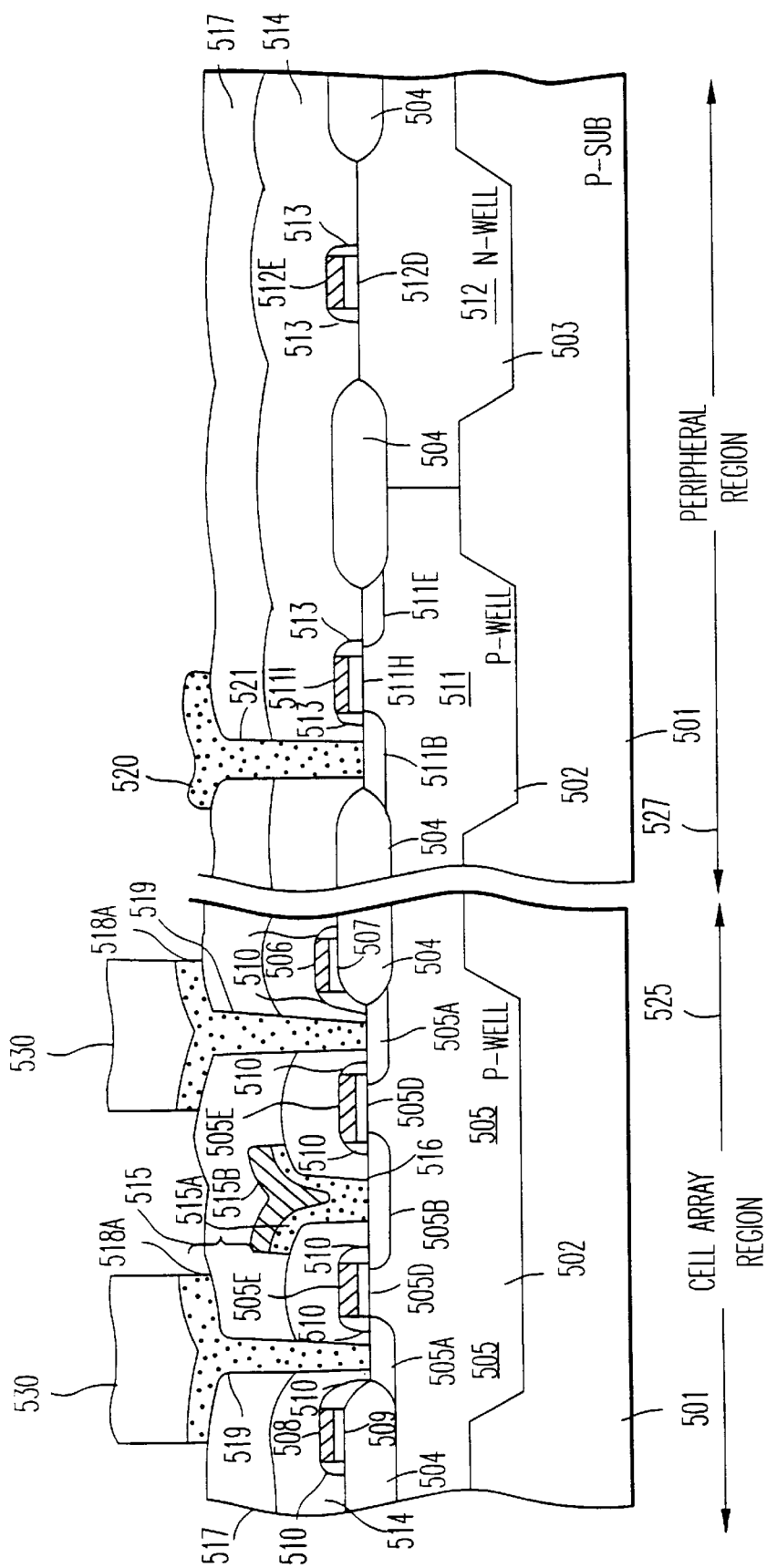
FIG. 12 is a sectional view showing the manufacturing process of the DRAM according to the present invention.

The contact holes 519 and 521 are respectively etched in the interlayer insulating film 514 over the source or drains 505*a* and 511*b*, as shown in FIG. 12. An n-type polysilicon layer is formed by CVD in the contact holes 519, 521 and on the interlayer insulating film 517, and a silicon oxide layer serving as the silicon oxide film 530 is formed thereon by CVD. A bottom part of the electrode 518*a* of the cylindrical capacitor 518, the silicon oxide film 530 and the contact pad 520 are formed by photolithography and etching.

Figure 13:
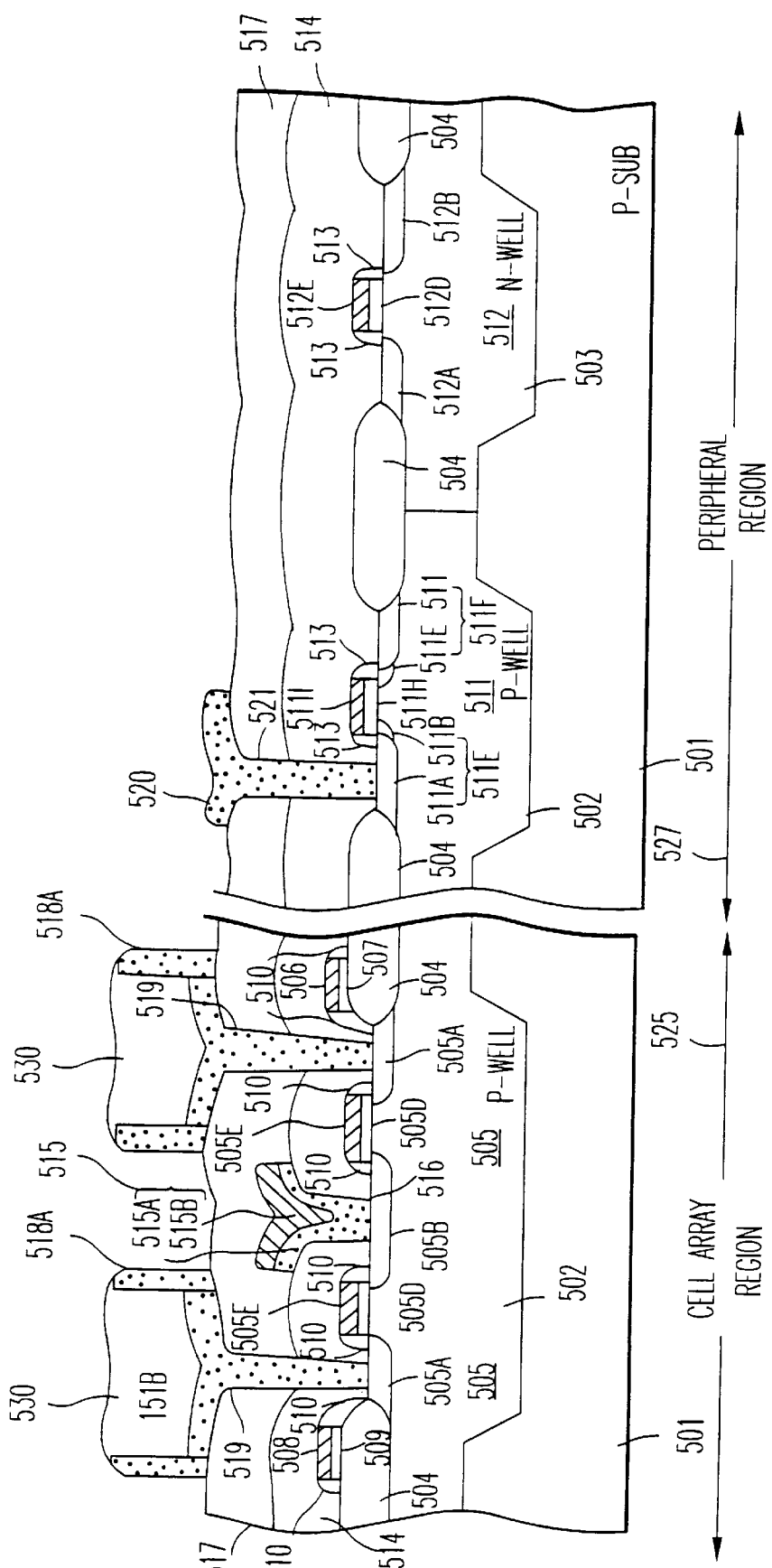
FIG. 13 is a sectional view showing the manufacturing process of the DRAM according to the present invention.

As shown in FIG. 13, the peripheral circuit region 527 is masked with resist utilizing photolithography, and in the memory cell array region, an n-type polysilicon layer is formed by CVD on the upper face and side wall of the silicon oxide film 530 and on the interlayer insulating film 517. This polysilicon layer is anisotropically etched to form the side wall part of the electrode 518*a*.

Figure 14:
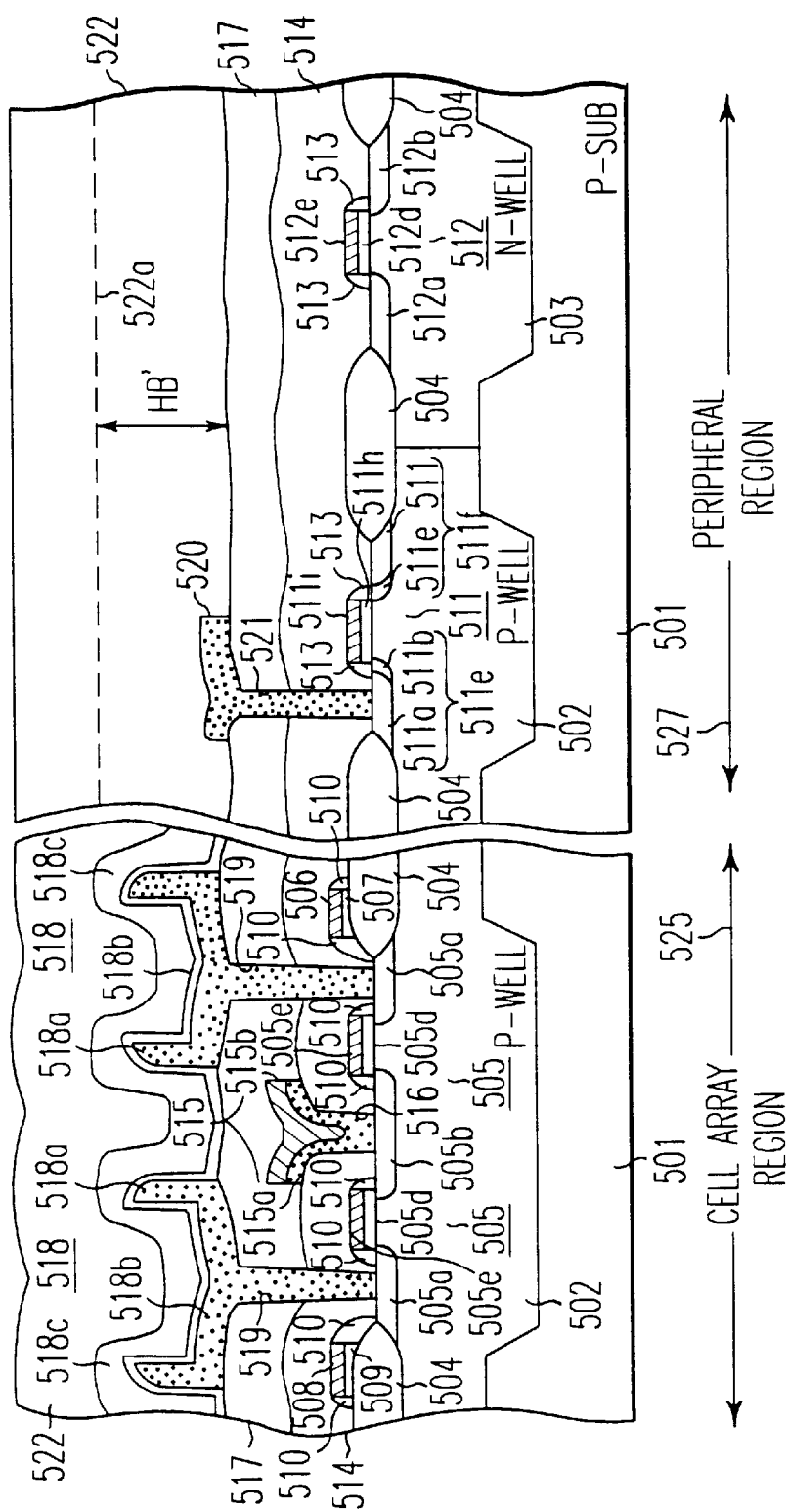
FIG. 14 is a sectional view showing the manufacturing process of the DRAM according to the present invention.

The silicon oxide film 530 is then removed, and a laminated layer of a silicon oxide layer and a silicon nitride layer serving as the dielectric film 518*b* of the capacitor 518 is formed by CVD method, as shown in FIG. 14. An aluminum layer serving as the cell plate 518*c* is formed thereon to complete the capacitor 518 in the memory cell array region 525. An interlayer insulating film 522 of BPSG is formed by CVD over the surface of the memory cell array region 525 and the peripheral circuit region 527.

Figure 15:
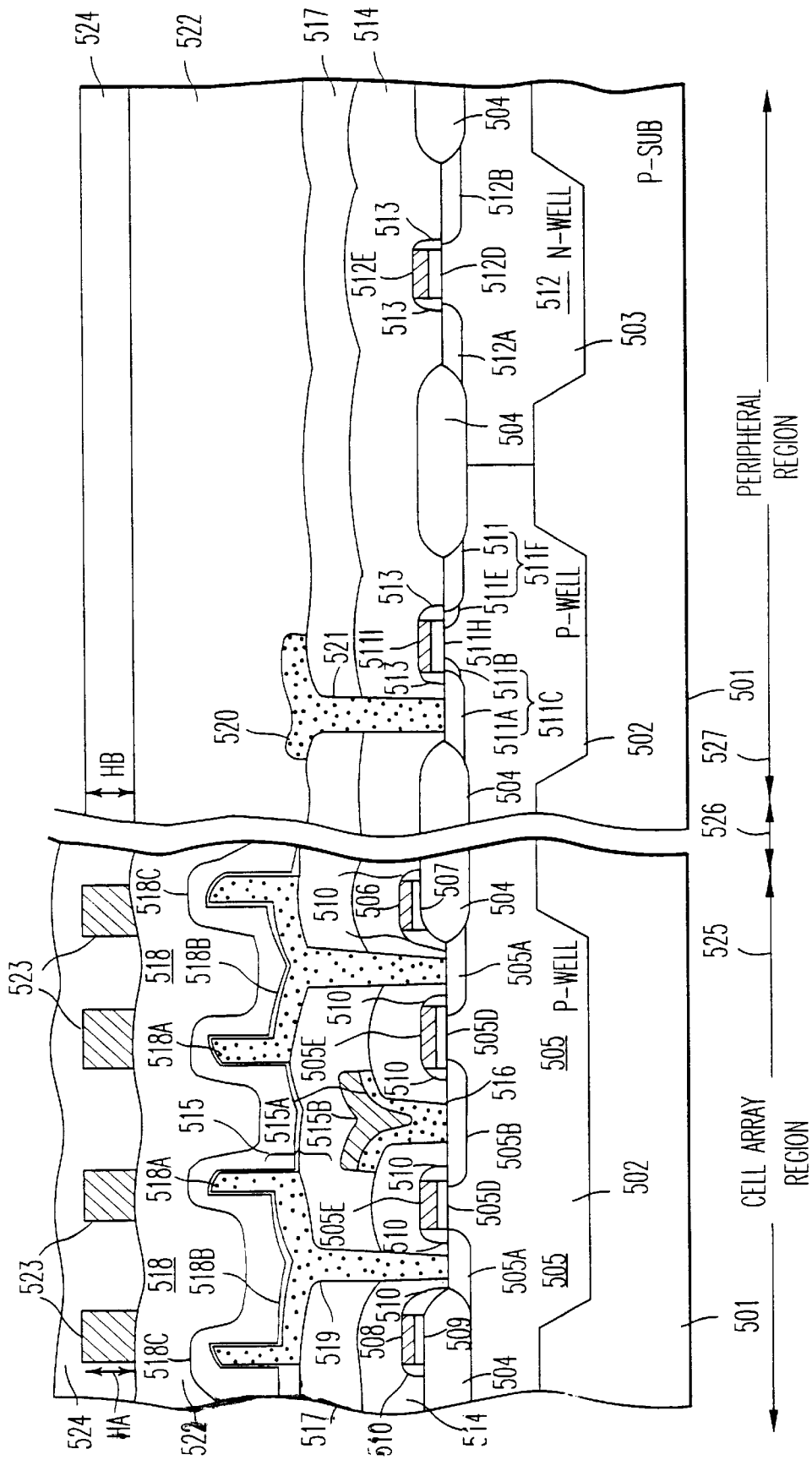
FIG. 15 is a sectional view showing the manufacturing process of the DRAM according to the present invention.
Figure 16:
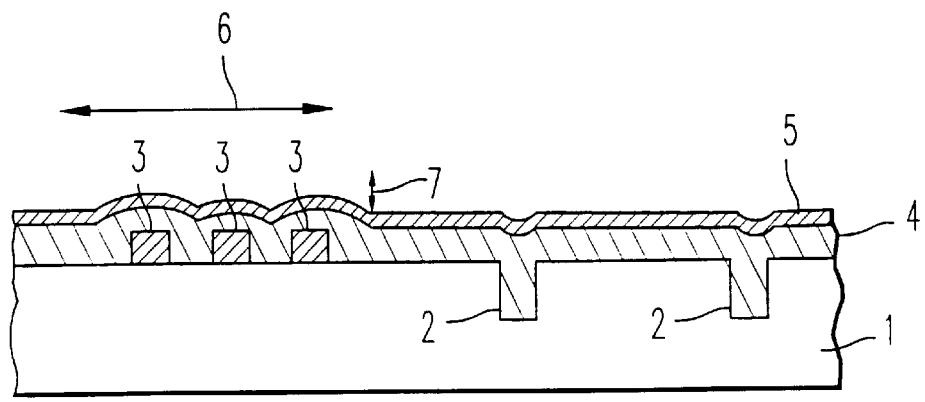
FIG. 16 is a sectional view showing a semiconductor device according to the prior art.
Figure 17:
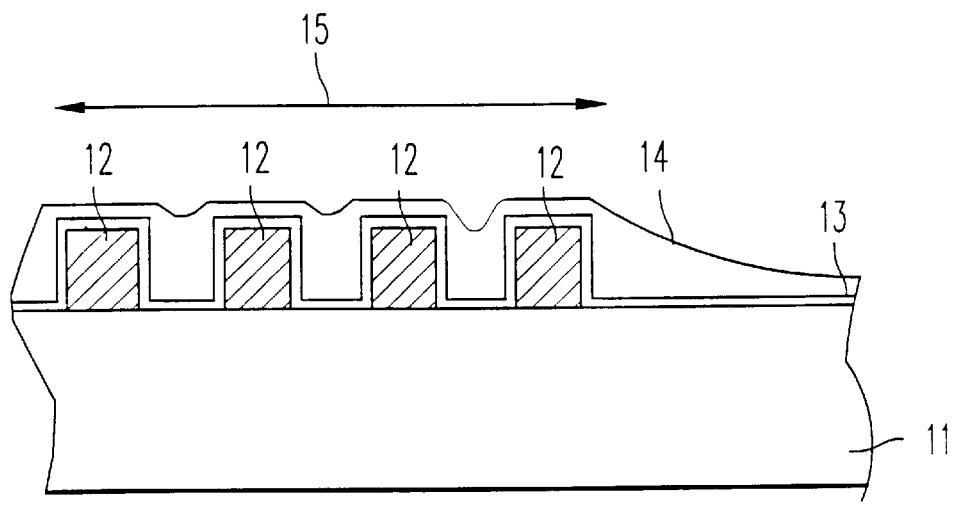
FIG. 17 is a sectional view showing a semiconductor device according to the prior art.

As shown in FIG. 15, an aluminum layer of HA in thickness is formed on the interlayer insulating film 522 by CVD or sputtering, and the shunt word lines 523 are formed utilizing photolithography and etching. The silicon oxide film 524 is formed by CVD employing a gas mixture composed of silane and hydrogen peroxide over the surface of the semiconductor substrate 501 including the memory cell array region 525, the boundary region 526 surrounding the memory cell array region 525 and the peripheral circuit region 527. The film thickness of the silicon oxide film 524 is made gradually smaller in the boundary region 526 in proportion to the distance from the memory cell array region 525, and the film is planarized in the peripheral circuit region 527. The film thickness HB is at least 50% of the thickness HA of the shunt word lines 523. This silicon oxide film 524 is formed so as to meet a film thickness condition of HA/2$\leq$HB by establishing film formation conditions beforehand in the same manner as described in the previous embodiment.

Then, in the peripheral region 527, contact hole 529 is etched in the interlayer insulating film 522 and the silicon oxide film 524 above the contact pad 520 (as shown in FIG. 8). An aluminum layer is formed in the contact hole 529 and on the silicon oxide film 524 in both of the memory cell array region 525 and the peripheral region 527 by CVD or sputtering. The power source line 528 is formed by photolithography and etching, and thus the DRAM shown in FIG. 8 is formed.

As described above, in the DRAM according to this embodiment, planarization of the silicon oxide film 524 is attained in the memory cell array region 525 where the shunt word lines are formed, by controlling the film thickness HB of the silicon oxide film in the peripheral circuit region 527 to be 50% or more of the thickness HA of the shunt word lines 523. Further, since the thickness HB of the silicon oxide film 524 in the peripheral circuit region is smaller than the thickness HA of the shunt word lines 523, the depth of the contact hole 529 is small, and the time for forming the contact hole 529 is shortened.

Although the silicon oxide film 524 is formed by CVD employing silane and hydrogen peroxide as a raw material gas in this embodiment, the silicon oxide film 524 may be formed by CVD employing either disilane and hydrogen peroxide or an organic silicon compound containing organic group (alkyl group), for example by TEOS, and hydrogen peroxide as a raw material gas in the same manner as previous embodiments.

Although only the silicon oxide film 524 is formed by CVD employing a gas mixture composed of a gas containing silicon atoms and hydrogen peroxide as a raw material gas, the interlayer insulating film 522 may also be formed using this method, such that film thickness of the interlayer insulating film 522 in the peripheral circuit region 527 is smaller than and at least 50% of the step difference of the cell plate 518c in the memory cell array region 525 (film 522a having a thickness HB' in FIG. 14). This film thickness is in a region such as the element isolation region 504 where no element is formed.

Further, the interlayer insulating film 517 may be formed by CVD employing a gas mixture composed of a silicon atom containing gas and hydrogen peroxide, such that film thickness of the interlayer insulating film 517 in the peripheral circuit region 527 is at least 50% of the step difference of the bit line 515 in the memory cell array region 525. This film thickness is in a region such as the element isolation region 504 where no element is formed.

The interlayer insulating film 514 may also be formed by CVD employing a gas mixture composed of a silicon atom containing gas and hydrogen peroxide, such that film thickness of the interlayer insulating film 514 in the peripheral circuit region 527 is at least 50% of the step difference of the word lines or gate electrodes 505e, 506, 508 in the memory cell array region 525. This film thickness is in a region such as the element isolation region 504 where no element is formed.

It is further understood that the foregoing description is a preferred embodiment of the disclosed device and method and that various changes and modifications may be made in the invention without departing from the spirit and scope thereof.

What is claimed as new and is desired to be secured by letters patent of the United States is:

1. A process for manufacturing a semiconductor device comprising:
    forming a plurality of wires having a prescribed thickness on a first region of a semiconductor substrate; and
    forming a silicon oxide film on said first region of said semiconductor substrate, on a second region of said semiconductor substrate surrounding said first region and on a third region of said semiconductor substrate surrounding said second region by chemical vapor deposition employing a gas mixture composed of a silicon atom containing gas and hydrogen peroxide, a thickness of said silicon oxide film becoming smaller in said second region in proportion to a distance from said first region, said silicon oxide film being planarized in said third region and a thickness of said silicon oxide film in said third region being at least 50% of but no more than said thickness of said wires.

2. A process for manufacturing a semiconductor device as recited in claim 1, wherein:
    said gas mixture is composed of silane and hydrogen peroxide.

3. A process for manufacturing a semiconductor device as recited in claim 1, wherein:
    said gas mixture is composed of disilane and hydrogen peroxide.

4. A process for manufacturing a semiconductor device as recited in claim 1, wherein:
    said gas mixture is composed of an organic silicon compound which contains one of an organic group and an alkyl group, and hydrogen peroxide.

5. A process for manufacturing a semiconductor device as recited in claim 4, wherein said organic silicon compound is tetraethylorthosilicate.

6. A process for manufacturing a semiconductor device comprising:
    forming an insulating layer on a semiconductor substrate;
    forming a plurality of bit lines having a step thickness on a first region of said insulating layer; and
    forming a first silicon oxide film on said first region of said semiconductor substrate and over said bit lines, on a second region of said semiconductor substrate surrounding said first region and on a third region of said semiconductor substrate surrounding said second region by chemical vapor deposition employing a gas mixture composed of a silicon atom containing gas and hydrogen peroxide;
    a thickness of said first silicon oxide film becoming smaller in said second region in proportion to a distance from said first region, said first silicon oxide film being planarized in said third region and a thickness of said first silicon oxide film in said third region being at least 50% of but no more than said thickness.

7. A process for manufacturing a semiconductor device as recited in claim 6, comprising:
    forming a plurality of capacitors each having an uneven cell plate with a step height on said first silicon oxide film in said first region of said semiconductor substrate; and
    forming a second silicon oxide film over said capacitors and over said first, second and third regions of said semiconductor substrate by chemical vapor deposition employing said gas mixture;
    a thickness of said second silicon oxide film becoming smaller in said second region in proportion to said distance from said first region, said second silicon oxide film being planarized in said third region and a thickness of said second silicon oxide film in said third region being at least 50% of but no more than said step height.

8. A process for manufacturing a semiconductor device as recited in claim 7, comprising:
    forming a plurality of wires having a thickness on said second silicon oxide film in said first region of said semiconductor substrate; and
    forming a third silicon oxide film over said wires and over said first, second and third regions of said semiconductor substrate by chemical vapor deposition employing said gas mixture;
    a thickness of said third silicon oxide film becoming smaller in said second region in proportion to said distance from said first region, said third silicon oxide film being planarized in said third region and a thickness of said third silicon oxide film in said third region being at least 50% of but no more than said thickness.

9. A process for manufacturing a semiconductor device as recited in claim 8, comprising:
    forming at least one of said first, second and third silicon oxide films to be at least one half of said step thickness, said step height and said thickness, respectively.

10. A process for manufacturing a semiconductor memory device on a semiconductor substrate having a memory cell region, a peripheral circuit region and a intermediate region disposed between said memory cell region and peripheral circuit region, comprising:
    forming a plurality of memory cell transistors in said memory cell region and having a first step height;

forming a plurality of word lines connected to selected ones of said memory cell transistors and having a second step height;

forming a plurality of wires over said transistors having a third step height; and forming a first silicon oxide film in said memory cell region and in said peripheral circuit region and over said plurality of wires, said first silicon oxide film having a first thickness in said memory cell region, a second thickness in said intermediate region and a third thickness in said peripheral circuit region;

wherein said first thickness is greater than said at third step height and said third thickness is at least 50% of but no more than said third step height.

11. A method as recited in claim 10, comprising:

forming a second silicon oxide film over said memory cell transistors in said memory cell region, said intermediate region and said peripheral circuit region;

said second silicon oxide film having a fourth thickness in said memory cell region, a fifth thickness in said intermediate region and a sixth thickness in said peripheral circuit region;

wherein said fourth thickness is greater than said at least one said first and second step heights and said sixth thickness is at least 50% of but no more than said at least one first and second step heights.

12. A method as recited in claim 10, comprising:

forming a plurality of cell capacitors connected to selected ones of said memory cell transistors and having a fourth step height;

forming a second silicon oxide film over said plurality of capacitors in said memory cell region, said intermediate region and said peripheral circuit region;

said second silicon oxide film having a fourth thickness in said memory cell region, a fifth thickness in said intermediate region and a sixth thickness in said peripheral circuit region;

wherein said fourth thickness is greater than said fourth step height and said sixth thickness is at least 50% of but no more than said fourth step height.

13. A method as recited in claim 11, comprising:

forming a plurality of cell capacitors connected to selected ones of said memory cell transistors and having a fourth step height;

forming a third silicon oxide film over said plurality of capacitors in said memory cell region, said intermediate region and said peripheral circuit region;

said third silicon oxide film having a seventh thickness in said memory cell region, an eighth thickness in said intermediate region and a ninth thickness in said peripheral circuit region;

wherein said seventh thickness is greater than said fourth step height and said ninth thickness is at least 50% of but no more than said fourth step height.

14. A method as recited in claim 13, comprising at least one of:

forming said first silicon oxide film to have said second thickness substantially continuously reducing from said first thickness to said third thickness;

forming said second silicon oxide films to have said fifth thickness substantially continuously reducing from said fourth thickness to said sixth thickness; and forming said third silicon oxide film to have said eighth thickness substantially continuously reducing from said seventh thickness to said ninth thickness.

15. A method as recited in claim 14, comprising:

forming at least one said first, second and third silicon oxide films such that at least one of said third, sixth and ninth thicknesses, respectively, is substantially uniform.

16. A method as recited in claim 13, comprising:

forming at least one of said first, second and third silicon oxide films from a gas mixture composed of a silicon atom containing gas and hydrogen peroxide.

17. A method as recited in claim 11, comprising:

forming said first silicon oxide film to having a thickness in said third region approximately at least 50% of said third step height.

18. A method as recited in claim 10, comprising forming said first silicon oxide film using chemical vapor deposition employing a gas mixture composed of a silicon atom containing gas and hydrogen peroxide.

19. A method as recited in claim 11, comprising forming said second silicon oxide film using chemical vapor deposition employing a gas mixture composed of a silicon atom containing gas and hydrogen peroxide.

20. A method as recited in claim 12, comprising forming said second silicon oxide film using chemical vapor deposition employing a gas mixture composed of a silicon atom containing gas and hydrogen peroxide.

* * * * *